(12) United States Patent
Iwai et al.

(10) Patent No.: US 9,041,004 B2
(45) Date of Patent: May 26, 2015

(54) FILMS OF NITRIDES OF GROUP 13 ELEMENTS AND LAYERED BODY INCLUDING THE SAME

(71) Applicant: NGK Insulators, Ltd., Aichi-prefecture (JP)

(72) Inventors: Makoto Iwai, Kasugai (JP); Takayuki Hirao, Nagoya (JP); Takashi Yoshino, Ama (JP)

(73) Assignee: NGK Insulators, Ltd., Aichi-prefecture (JP)

( * ) Notice: Subject to any disclaimer, the term of this patent is extended or adjusted under 35 U.S.C. 154(b) by 0 days.

(21) Appl. No.: 14/167,667

(22) Filed: Jan. 29, 2014

(65) Prior Publication Data

US 2014/0197420 A1 Jul. 17, 2014

Related U.S. Application Data

(63) Continuation of application No. PCT/JP2012/070778, filed on Aug. 9, 2012.

(30) Foreign Application Priority Data

Aug. 10, 2011 (JP) ................. 2011-174996
Mar. 21, 2012 (JP) ................. 2012-063238

(51) Int. Cl.
*H01L 29/15* (2006.01)
*H01L 33/32* (2010.01)
(Continued)

(52) U.S. Cl.
CPC .............. *H01L 33/32* (2013.01); *C30B 19/02* (2013.01); *H01L 21/0237* (2013.01);
(Continued)

(58) Field of Classification Search
CPC ...................................................... H01L 33/32
USPC .............................................. 257/76
See application file for complete search history.

(56) References Cited

U.S. PATENT DOCUMENTS 6,864,158 B2 3/2005 Ishida
7,227,172 B2 6/2007 Kitaoka et al.
(Continued)

FOREIGN PATENT DOCUMENTS

JP 2002-217116 A 8/2002
JP 2002-293699 A 10/2002
(Continued)

OTHER PUBLICATIONS

International Search Report for PCT Patent App. No. PCT/JP2012/070778 (Oct. 30, 2012).
(Continued)

*Primary Examiner* — Jarrett Stark
*Assistant Examiner* — Mohammad M Hoque
(74) *Attorney, Agent, or Firm* — Cermak Nakajima & McGowan LLP; Tomoko Nakajima

(57) ABSTRACT

A film 3 of a nitride of a group 13 element is grown on a seed crystal substrate 11 by flux process from a melt containing a flux and a group 13 element under nitrogen containing atmosphere. The film 3 of a nitride of a group 13 element includes an inclusion distributed layer 3a in a region distant from an interface of the film of a nitride of group 13 element on the side of the seed crystal substrate 11 and containing inclusions derived from components of the melt, and an inclusion depleted layer 3b, with the inclusion depleted. provided on the layer 3a.

9 Claims, 23 Drawing Sheets

(51) Int. Cl.
  *C30B 19/02*  (2006.01)
  *H01L 21/02*  (2006.01)
  *C30B 29/40*  (2006.01)
  *C30B 29/38*  (2006.01)
  *H01L 33/00*  (2010.01)

(52) U.S. Cl.
  CPC ..... *H01L 21/0254* (2013.01); *H01L 21/02625* (2013.01); *C30B 29/403* (2013.01); *C30B 29/38* (2013.01); *H01L 21/0242* (2013.01); *H01L 21/02458* (2013.01); *H01L 21/02576* (2013.01); *H01L 33/007* (2013.01)

(56) References Cited

U.S. PATENT DOCUMENTS

| | | | |
|---|---|---|---|
| 7,905,958 | B2 | 3/2011 | Sasaki et al. |
| 8,344,402 | B2 | 1/2013 | Niki et al. |
| 8,344,403 | B2 | 1/2013 | Niki et al. |
| 2002/0182889 | A1 | 12/2002 | Solomon et al. |
| 2004/0219762 | A1 | 11/2004 | Shimoda et al. |
| 2004/0262630 | A1* | 12/2004 | Kitaoka et al. ............ 257/189 |
| 2005/0048686 | A1 | 3/2005 | Kitaoka et al. |
| 2007/0215035 | A1 | 9/2007 | Kitaoka et al. |
| 2009/0290610 | A1 | 11/2009 | Eichler et al. |
| 2010/0213576 | A1 | 8/2010 | Hiranaka et al. |
| 2010/0260656 | A1 | 10/2010 | Minemoto et al. |
| 2011/0156212 | A1 | 6/2011 | Arena |
| 2011/0274609 | A1 | 11/2011 | Shimodaira et al. |
| 2012/0012984 | A1 | 1/2012 | Shimodaira et al. |
| 2012/0175740 | A1 | 7/2012 | Hirao et al. |
| 2014/0147953 | A1 | 5/2014 | Iwai et al. |
| 2014/0158978 | A1 | 6/2014 | Iwai et al. |

FOREIGN PATENT DOCUMENTS

| | | | |
|---|---|---|---|
| JP | 2004-224600 | A | 8/2004 |
| JP | 2005-247615 | A | 9/2005 |
| JP | 2005-263622 | A | 9/2005 |
| JP | 2005-306709 | A | 11/2005 |
| JP | 2006-008416 | A | 1/2006 |
| JP | 2006-036622 | A | 2/2006 |
| JP | 2006-080497 | A | 3/2006 |
| JP | 2006-332714 | A | 12/2006 |
| JP | 2007-149988 | A | 6/2007 |
| JP | 2009-507364 | * | 2/2009 |
| JP | 2009-507364 | A | 2/2009 |
| JP | 2010-052967 | A | 3/2010 |
| JP | 2010-168236 | A | 8/2010 |
| JP | 2011-105586 | A | 6/2011 |
| JP | 2011-207677 | A | 10/2011 |
| WO | WO2005/111278 | A1 | 11/2005 |
| WO | WO2009/047894 | A1 | 4/2009 |
| WO | WO2010/024987 | A1 | 3/2010 |
| WO | WO2010/084675 | A1 | 7/2010 |
| WO | WO2010/092736 | A1 | 8/2010 |

OTHER PUBLICATIONS

Written Opinion for PCT Patent App. No. PCT/JP2012/070778 (Oct. 30, 2012).

Supplementary European Search Report for European Patent App. No. 12821939.1 (Oct. 31, 2014).

Office Action for U.S. Appl. No. 14/175,352 (Nov. 6, 2014).

Office Action for Japanese Patent App. No. 2013-528093 (Nov. 26, 2014).

* cited by examiner

Fig. 2
(a)
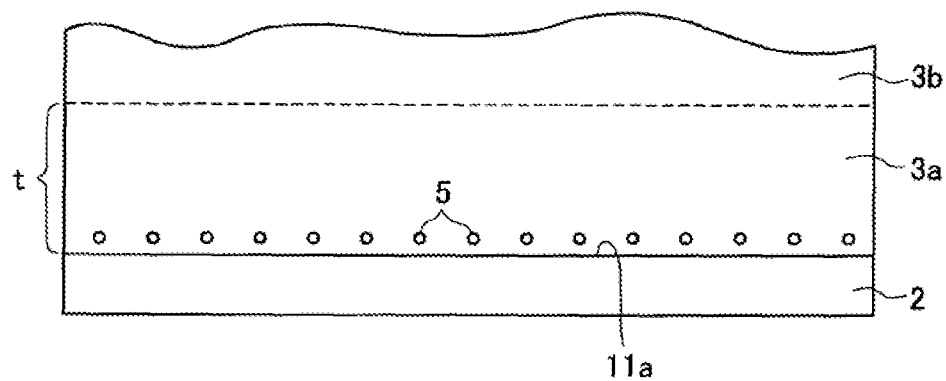
(b)
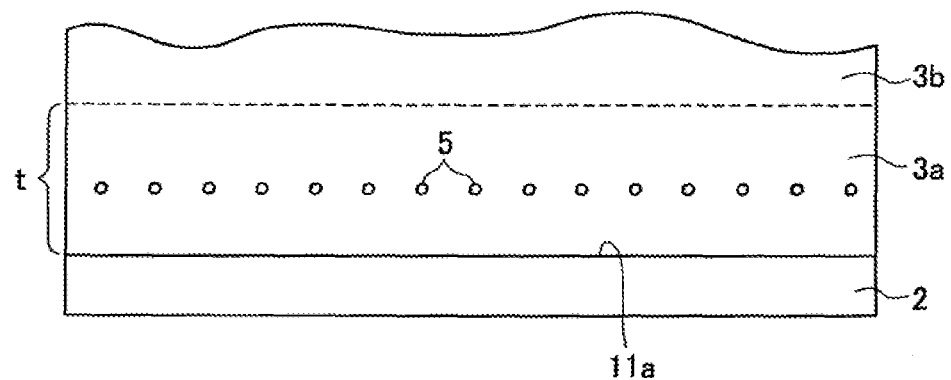

Fig. 3
(a)
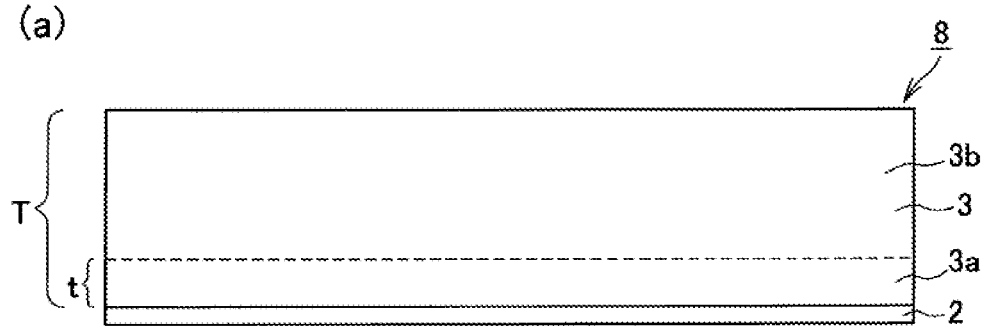
(b)
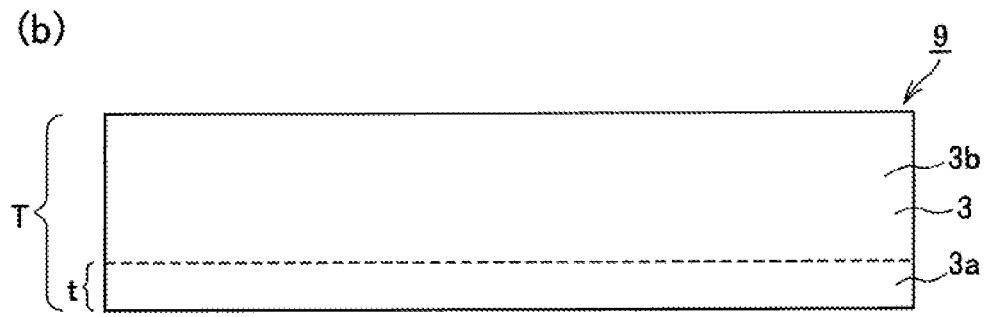
(c)
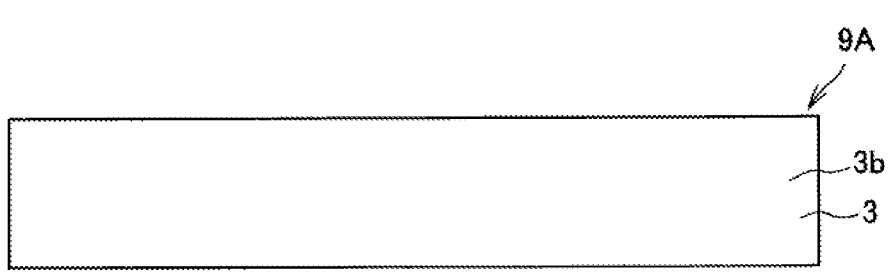

FILMS OF NITRIDES OF GROUP 13 ELEMENTS AND LAYERED BODY INCLUDING THE SAME

FIELD OF THE INVENTION

The present invention relates to a film of nitride of group 13 element and a layered body including the same. The film of nitride of group 13 element and layered body can be used for a white LED with improved color rendering index, a blue-violet laser disk for high-speed and high-density optical memory, a power device for an inverter for a hybrid car or the like.

BACKGROUND ARTS

It has been recently and intensively studied that a nitride of a group 13 element such as gallium nitride is used to produce a semiconductor device such as a blue ray laser, white ray laser, blue-violet ray semiconductor laser and the like and that the device is applied to various kinds of electronic appliances.

Such prior gallium nitride-based semiconductor device has been mainly produced by vapor phase process. Specifically, it has been produced by growing a thin film of gallium nitride by heteroepitaxial growth on a sapphire or silicon carbide substrate by organic metal vapor phase deposition (MOCVD) or the like. In this case, the substrate and thin film of gallium nitride are different from each other in thermal expansion coefficient and lattice constant, so that dislocation (a kind of lattice defect of crystal) is generated in high density in the grown gallium nitride. It has been thus difficult to obtain gallium nitride of a low dislocation density and high quality according to the vapor phase process.

Thus, according to Japanese patent Publication No. 2002-217116A, an under layer of GaN single crystal or the like is formed on a seed crystal substrate by vapor phase process, and an over layer of GaN or the like is then formed again on the under layer. It is generated a region of void or indium precipitation along an interface of the under and over layers so that it is tried to reduce threading dislocation from the under layer to the over layer.

On the other hand, it has been developed liquid phase process in addition to the vapor phase process. So called flux method is one of the liquid phase processes. In the case of gallium nitride, sodium metal is used as a flux so that it is possible to lower temperature required for crystal growth of gallium nitride to around 800° C. and pressure to several MPa. Specifically, nitrogen gas is dissolved into mixed melt of the sodium metal and gallium metal so that gallium nitride is crystallized and grown in the melt in the supersaturating state. According to such kind of liquid phase process, the dislocation can be reduced compared with the vapor phase process, so that it is possible to obtain gallium nitride having a low dislocation density and high quality.

Such flux process has been also extensively researched and developed. For example, according to Japanese Patent Publication No. 2005-263622A, the speed of crystal growth of gallium nitride in the direction of thickness (direction of C-axis) is as low as about 10 μm/h and ununiformed nucleation tends to occur along liquid-vapor interface of the melt in prior flux method. It is thus disclosed a method of producing gallium nitride for overcoming such problems.

The applicant filed Japanese Patent Publication No. 2010-168236A and described the correlation between power of agitation and generation of inclusion. According to the Patent document, it was disclosed to control the growth rate in a preferred range and to adjust the speed and inversion condition of rotation of a crucible, for growing a crystal free of the inclusions.

SUMMARY OF THE INVENTION

The inventors have studied, in a nitride single crystal produced by flux process on a seed crystal, a method for preventing inclusions therein and further improving quality of the nitride single crystal, as disclosed in Japanese Patent Publication No. 2010-168236A. On the viewpoint of the quality of the nitride single crystal, it is very important to further reduce the defect density on the viewpoint of improving the luminous efficiency or the like. However, there has been a technical limit on this viewpoint and the breakthrough has thus been demanded.

An object of the present invention is, in a nitride single crystal formed on a seed crystal by flux method, to further reduce surface defect density.

The present invention provides a film of a nitride of a group 13 element and grown on a seed crystal substrate by flux process from a melt comprising a flux and a group 13 element under nitrogen containing atmosphere. The film includes an inclusion distributed layer in a region distant by 50 μm or less from an interface of the film of a nitride of group 13 element on the side of the seed crystal substrate and including inclusions derived from components of the melt, and an inclusion depleted layer with the inclusion depleted formed on the inclusion distributed layer.

The present invention further provides a film of a nitride of a group 13 element, obtained by removing the inclusion distributed layer from the above film of a nitride of a group 13 element.

The present invention further provides a layered body comprising a substrate of a single crystal, a seed crystal film formed on the substrate and the film of a single crystal of a nitride of a group 13 element formed on the seed crystal film.

The present invention further provides a layered body including a seed crystal film, and the film of a single crystal of a nitride of a group 13 element formed on the seed crystal film.

"Single crystal" referred to in the present specification is defined as follows. Although "single crystal includes typical single crystals where atoms are regularly arranged throughout the whole of the crystal, "single crystal" is not limited to such typical ones and includes those generally referred to in the Industries. That is, "single crystal" may include a some degree of defects, or may include internal stress, or may contain impurities in the crystal structure, and includes any single crystal which is distinguishable from polycrystals (ceramics).

In the study of forming a nitride single crystal on a seed crystal substrate by flux method, the inventors tried not to simply reduce the inclusions but to leave an appropriate amount of inclusions in a region near the interface of the nitride single crystal and seed crystal. It is proved that the defect density of the nitride single crystal can be further reduced compared with that in the case of the nitride single crystal with very few inclusions, and thus made the present invention.

That is, by growing a nitride single crystal including inclusions with a size of several microns or so only in a region having a thickness of 50 microns during an initial stage of the crystal growth by flux method, it is possible to considerably reduce the dislocation of the crystal and thereby to provide preferable properties for various devices. Such discovery is made contrary to common knowledge of skilled artisans in the art of growing nitride single crystals by flux method.

BRIEF DESCRIPTION OF THE DRAWINGS

FIGS. 2(a) and 2(b) are diagrams schematically showing a region of the nitride single crystal 3 near the seed crystal film.

FIG. 3(a) is a diagram schematically showing a layered body, FIG. 3(b) is a diagram schematically showing a film 3 of a nitride single crystal of a group 13 element, and FIG. 3(c) is a diagram schematically showing a nitride single crystal 9A obtained by removing an inclusion distributed layer from the film 3.

EMBODIMENTS FOR CARRYING OUT THE INVENTION (Applications)

The film of the nitride single crystal and layered body of the present invention may be used in technical fields requiring high quality, including a white LED with improved color rendering index expected as a post-fluorescent lamp, a blue-violet laser disk for high-speed and high-density optical memory, LED and laser for light source of pure blue ray and pure green ray, and a power device for an inverter for a hybrid car or the like.

(Seed Crystal Substrate)

Figure 1:
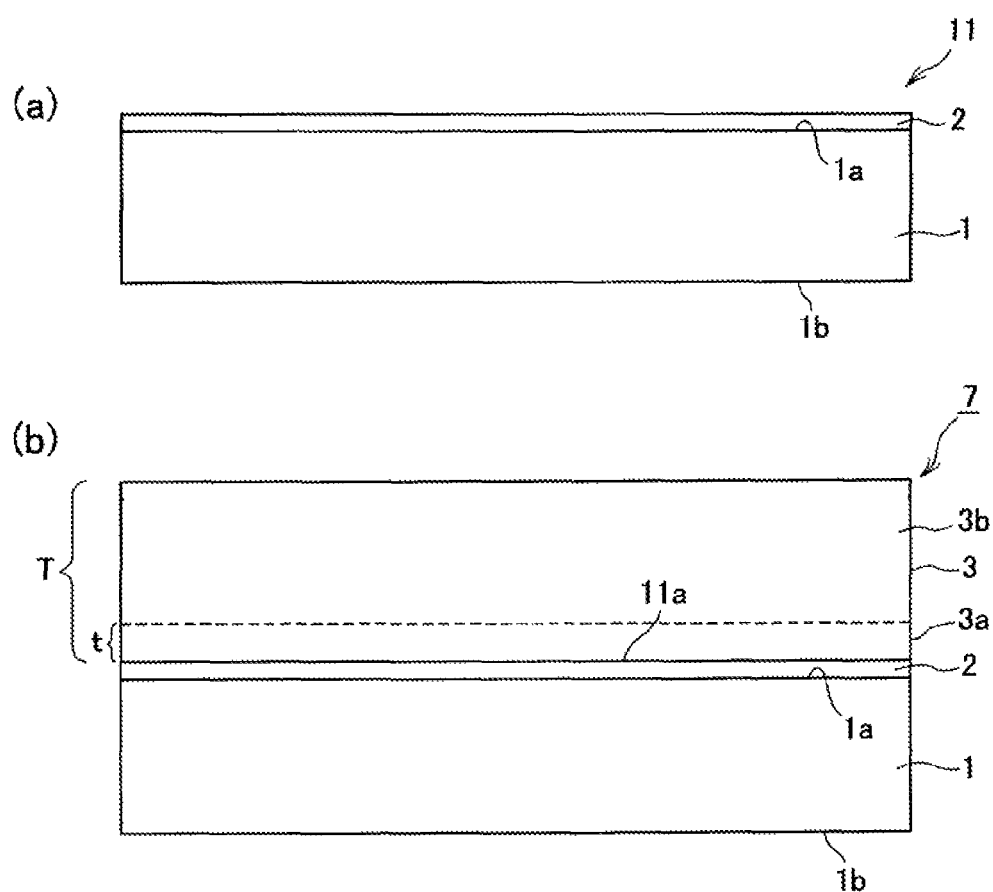
FIG. 1(a) is a cross sectional view schematically showing a seed crystal substrate 11.
FIG. 1(b) is a cross sectional view schematically showing a nitride single crystal 3 formed on the seed crystal substrate 2 by flux method.

First, FIG. 1(a) shows a seed crystal substrate 11. A seed crystal film 2 is formed on an upper face 1a of a single crystal substrate 1. 1b represents a back face. A buffer layer may be provided between the substrate 11 and seed crystal film 2. Further, the seed crystal substrate may be a thin plate composed of a seed crystal.

Although materials of the single crystal substrate for the seed crystal substrate is not limited, it includes sapphire, AlN template, GaN template, self-standing GaN substrate, silicon single crystal, SiC single crystal, MgO single crystal, spinel ($MgAl_2O_4$), and perovskite composite oxide such as $LiAlO_2$, $LiGaO_2$, $LaAlO_3$, $LaGaO_3$ or $NdGaO_3$ and SCAM ($ScAlMgO_4$). A cubic perovskite composite oxide represented by the composition formula $[A_{1-y}(Sr_{1-x}Ba_x)_y][(Al_{1-z}Ga_z)_{1-u}.Du]O_3$ (wherein A is a rare earth element; D is one or more elements selected from the group consisting of niobium and tantalum; y=0.3 to 0.98; x=0 to 1; z=0 to 1; u=0.15 to 0.49; and x+z=0.1 to 2) is also usable.

A material forming the seed crystal film may preferably be a nitride of a group 13 element, including boron nitride (BN), aluminum nitride (AlN), gallium nitride (GaN), indium nitride (InN), thallium nitride (TlN) and the mixed crystals thereof (AlGaN, AlGaInN or the like).

Further, in the case that the single crystal substrate is composed of a plate of a nitride of a group 13 element, the material includes boron nitride (BN), aluminum nitride (AlN), gallium nitride (GaN), indium nitride (InN), thallium nitride (TlN) and the mixed crystals thereof (AlGaN, AlGaInN or the like).

The buffer layer and seed crystal film may preferably be formed by vapor phase process, including metal organic chemical vapor deposition (MOCVD), hydride vapor phase epitaxy (HYPE), pulse excited deposition (PXD), MBE and sublimation processes. Metal organic chemical vapor deposition process is particularly preferable.

(Characteristics of Nitride Film)

Next, as shown in FIG. 1(b), a nitride film 3 is formed on the seed crystal substrate by flux process. Here, according to the present invention, an inclusion distributed layer 3a is formed within a region distant from 50 μm or smaller from an interface of the seed crystal substrate and the nitride film, and an inclusion depleted layer 3b is formed thereon. Besides, "T" represents a thickness of the nitride film 3, and "t" represents a thickness of the inclusion distributed layer which is 50 μm or smaller.

According to the present invention, the inclusion distributed layer 3a is provided in a region distant by 50 μm or smaller from the interface 11a of the film of nitride of a group 13 element on the side of the seed crystal substrate. 5 represents the inclusions. "Inclusion" referred to herein means a heterogenous phase included in the nitride film and composed of a material derived from components contained in a melt. The components contained in the melt means flux (alkali metals such as sodium), the group 13 element as a raw material of the nitride and the other additives. Group 13 element means group 13 element according to the Periodic Table determined by IUPAC. The group 13 element is specifically gallium, aluminum, indium, thallium or the like. Further, the additives include carbon, metals of low melting points (tin, bismuth, silver, gold), and metals of high melting points (iron, manganese, titanium, chromium and the other transition metals). The metal of low melting point may be added for preventing oxidation of sodium and metal of high melting point may be contained from a container for containing a crucible, a heater of a growing furnace or the like.

The material forming the inclusion is typically an alloy of the flux and the group 13 element metal, mixture of the pure metal and alloy, or carbon, or aggregate or polycrystalline material of fine crystals of the nitride of group 13 element.

The inclusion distributed layer and depleted layer are measured as follows.

That is, in the inclusion distributed layer, the inclusions are distributed and can be observed by means of a transmission type optical microscope. Specifically, the distribution of the inclusions can be observed by the optical microscope in a viewing field of height 50 μm from the interface and a width of 100 μm at a magnitude of 200.

In the inclusion distributed layer, the inclusions are basically provided in the direction parallel with the interface. Here, the inclusions may be arranged in the direction parallel with the interface to form an arranged layer, or may be randomly distributed.

Further, the whole of the region distant by 50 μm or smaller from the interface may be made the inclusion distributed layer. Alternatively, a part of the region distant by 50 μm or smaller from the interface may be made the inclusion distributed layer and the reminder may be free from the inclusions. In other words, it is not necessary that the inclusions are distributed over the whole of the region distant by 50 μm or smaller from the interface.

Specifically, the inclusions are observed for each of five layers each having a thickness of 10 μm and arranged from the interface in the direction of the thickness of the film. Then, in each of the five layers, it is observed whether the inclusions are distributed or not. More preferably, a ratio of area of the inclusions in at least one of the layers may preferably be 1 percent or higher and more preferably 2 percent or higher. Although the upper limit is not particularly limited, the crystallinity would tend to be deteriorated as the inclusions are too much. On the viewpoint, the ratio of the area of the inclusions may preferably be 10 percent or lower, more preferably be 7 percent or lower and most preferably be 5 percent or lower.

Further, preferably, in the whole of the region distant by 50 μm or smaller from the interface, the ratio of the area of the inclusions may preferably be 1 percent or higher and more preferably be 2 percent or higher. Although the upper limit is not particularly limited, the crystallinity would tend to be deteriorated as the inclusions are too much. On the viewpoint, the ratio of the area of the inclusions may preferably be 10 percent or lower, more preferably be 7 percent or lower and most preferably be 5 percent or lower.

Here, the ratio of the area of the inclusions in the inclusion distributed layer is calculated as follows. That is, as shown in FIG. 2 and FIGS. 6 to 13, the seed crystal and nitride film thereon are cut out along the cross section, and the cross section is polished using diamond slurry of grain size of about 1 μm. An image of the cross section is then taken by a transmission type optical microscope at a magnitude of 200 and the thus obtained image is subjected to binarization. The binarization is performed by "Image pro plus" supplied by Media Cybertics corporation in the U.S.

Here, it is specifically described a method of the binarization. First, the image taken by a transmission type optical microscope is stored in a personal computer in non-compressed format (TIFF format). A compressed format (jpeg) is not preferred since the image is deteriorated. Further, it is preferred that the image is stored at a high pixel number of 1M pixel or higher. The image is then converted based on 8 bit gray scale. That is, each pixel of the image is categorized into gradations of 0 to 255. The gradation of the peak intensity is read out by an intensity distribution function of a software ("display range" is selected in the above software). This is labeled as "$X_{peak}$". Further, it is read out a value of the gradation distributed at 99.9 percent from the upper end of the gradation distribution. This value is labeled as "$X_{99.9}$". It is then decided a threshold value for the binarization. The gradations are divided into two categories such that white is assigned for the gradations below the threshold value and black is assigned for those above the threshold value. The threshold value is calculated based on $X_{peak} \times 2 - X_{99.9}$. The black parts in the binarized image correspond with the inclusions. Then, for a region to be targeted, the area of the inclusions is divided by total area of the inclusion distributed layer to obtain the ratio of area in the inclusion distributed layer.

For example, according to an example of FIG. 2(a), inclusions 5 are arranged in the vicinity of the interface 11a. According to an example of FIG. 2(b), the inclusions 5 are arranged in a layer distant from the interface 11a. In both cases, for each of the layers each having a thickness of 10 μm arranged from the interface, the area is assigned as a denominator and the area of the inclusions contained in the layer is assigned as a numerator.

The inclusion depleted layer means that the distribution of the inclusions are not observed, provided that it is observed by an optical micrograph at a magnitude of 200 for a viewing area of a height of 50 μm×width of 100 μm. However, it is permitted that, in the inclusion depleted layer, a small amount of inclusions may be inevitably precipitated. Specifically, the ratio of the area of the inclusions may preferably be lower than 1 percent and more preferably be 0.5 percent or lower, and most preferably the inclusions are not substantially observed. Further, preferably, a region from the surface of the film to the position distant from the interface by 50 μm is occupied by the inclusion depleted layer.

Further, in the inclusion distributed layer, the area of each of the inclusions is preferably small, more preferably 60 μm² or smaller and most preferably be 20 μm² or smaller. However, it is permitted that an inclusion having an area larger than 60 μm² is precipitated due to deviation of the production. Even in such case, a number of the inclusions whose area exceed 60 μm² is preferably 2 or smaller and most preferably 1 or smaller, in a field of observation of 50 μm×100 μm.

Although the thickness "T" of the film of nitride of group 13 element is not limited, the thickness may preferably be 50 μm or larger, and more preferably be 100 μm or larger. Although the upper limit of "T" is not particularly defined, "T" may be made 5 mm or smaller on the viewpoint of the production.

(Production of the Inventive Nitride Film)

A layered body 7 shown in FIGS. 1(b) and 2 may be utilized as a member for a device by itself. However, depending on applications, as a layered body 8 shown in FIG. 3(a), only the single crystal substrate 1 may be removed by grinding or the like. Alternatively, as shown in FIG. 3(b), the seed crystal film 2 may be further removed to leave the nitride film 3 only, which may be utilized as a substrate 9 for a device. Further, as shown in FIG. 3(c), the inclusion distributed layer 3a is removed from the nitride film 3 to provide a substrate 9A composed of only the inclusion depleted layer for producing a device.

For utilizing the film of nitride of group 13 element and the layered body for white LED with improved color rendering index, a blue-violet laser for high-speed and high-density optical memory, LED and laser for light sources of pure blue ray and pure green ray, and a power device for an inverter for a hybrid car or the like, it is necessary to polish a surface of the film of nitride of group 13 element thus formed. In this case, when the warping of the film of nitride of group 13 element is small, it is possible to facilitate the adhesion of the film onto a polishing surface plate and thereby to reduce an amount of polishing required. Further, in the case that a functional layer is formed on the film of nitride of group 13 element by vapor phase process or the like, the quality of the functional layer can be improved.

Here, it is effective to reduce the warping of the film by providing the inclusion distributed layer according to the present invention. This effect is most considerable when the thickness of the inclusion depleted layer is 20 to 0.1 provided when that of the thickness of the inclusion distributed layer is assigned to 1.

That is, when the thickness of the inclusion depleted layer is 20 or lower provided when that of the thickness of the inclusion distributed layer is assigned to 1, the effect of reducing the warping is considerable. On the viewpoint, the thickness of the inclusion depleted layer may preferably be 10 or lower.

Further, when the thickness of the inclusion depleted layer is 0.1 or more provided when that of the thickness of the inclusion distributed layer is assigned to 1, the quality of the functional layer formed on the film of nitride of group 13 element can be improved. On the viewpoint, the thickness of the inclusion depleted layer may more preferably be 0.5 or more.

The warping of the inventive film after the growth may preferably be 200 μm or smaller and more preferably be 150 μm or smaller, on the viewpoint of facilitating the fixation of the substrates on a polishing plate for the polishing process.
(System and Conditions for Production)

Figure 4:
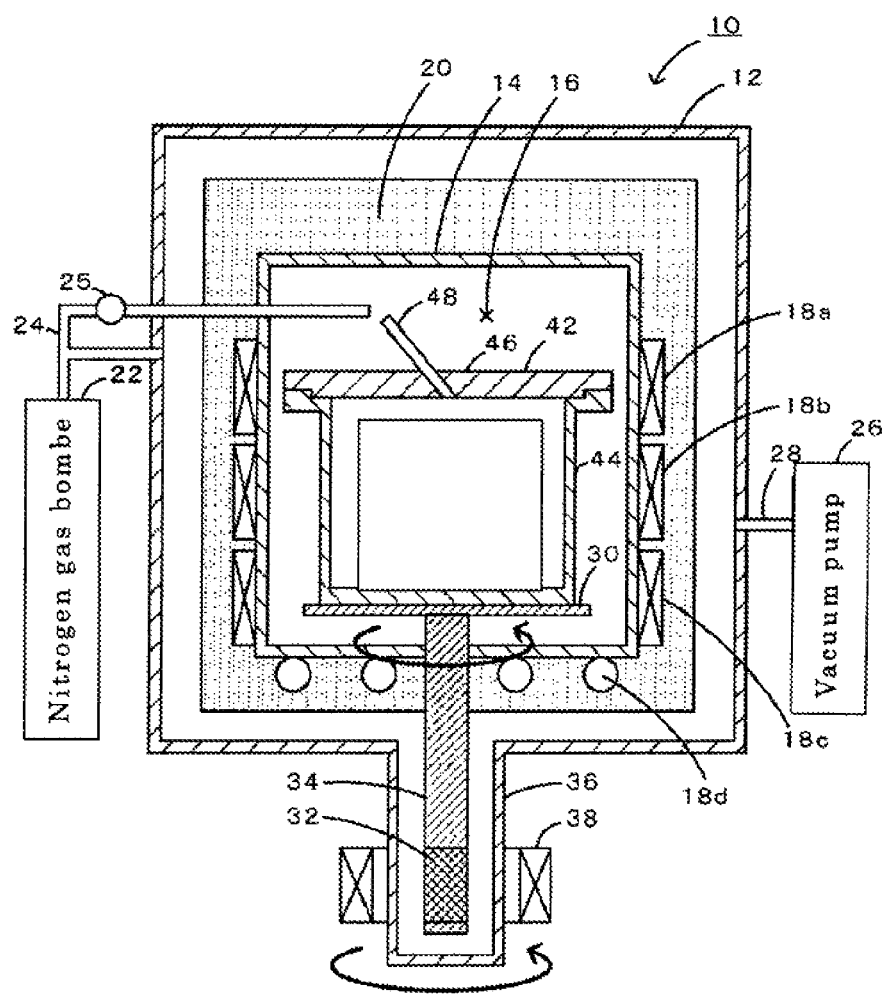
FIG. 4 is a diagram schematically showing a system utilizable for producing the inventive nitride single crystal.
Figure 5:
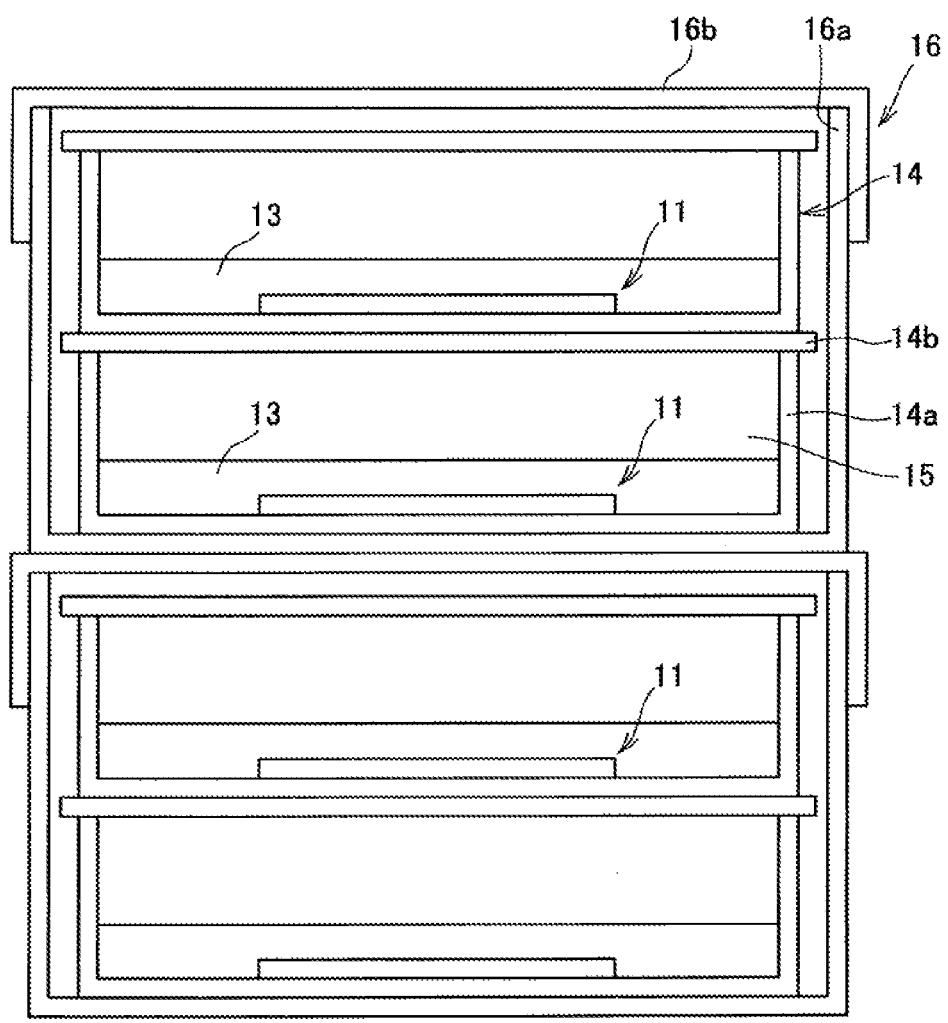
FIG. 5 is a diagram schematically showing a container utilizable for producing the inventive nitride single crystal.

FIGS. 4 and 5 show construction of a system usable for producing the inventive nitride film.

A system 10 for producing a crystal includes a pressure container 12 having functions of vacuum suction and supply of pressurized nitrogen gas, a rotatable table 30 set in the pressure container 12, and an outer container 42 mounted on the rotatable table 30.

The pressure container 12 is formed to a cylindrical shape having upper and lower disks and defines a heating space 16 surrounded by a heater cover 14. A temperature in the heating space 16 can be controlled with an upper heater 18a, a medium heater 18b and a lower heater 18c arranged vertically on a side face of the heater cover 14 as well as a bottom heater 18d positioned on a bottom face of the heater cover 14. The insulation property of the heating space 16 is improved by a heat insulator 20 surrounding and covering the heater cover 14. Further, a nitrogen gas pipe 24 from a nitrogen gas bombe 22 and vacuum suction pipe 28 from a vacuum pump 26 are connected to the pressure container 12. The nitrogen gas pipe 24 penetrates through the pressure container 12, heat insulator 20 and heater cover 14 and is opened to the inside of the heating space 16. The nitrogen gas pipe 24 is branched in an intermediate pipe so that the pipe is opened to a space between the pressure container 12 and heat insulator 20. Although the heater cover 14 is not completely sealed, nitrogen gas is supplied to both outside and inside of the heater cover 14 so as to prevent a large difference of pressures in the outside and inside of the heater cover 14. The intermediate branched pipe of the nitrogen gas pipe 24 communicating with the inside of the heating space 16 is equipped with a mass flow controller 25 having a function of adjusting a flow rate. The vacuum suction pipe 28 penetrates through the pressure container 12 and is opened to a space between the pressure container 12 and heat insulator 20. When the outside of the heater cover 14 is made vacuum state, the heating space 16 communicated thereto with the nitrogen gas pipe 24 is also made vacuum state.

The rotatable table 30 is formed into cylindrical shape and positioned in a lower part of the heating space 16. A rotatable shaft 34 with an inner magnet 32 is fitted to a lower face of the rotatable table 30. The rotatable shaft 34 penetrates through the heater cover 14 and heat insulator 20 and is inserted into a cylindrical casing 36 integrated with the lower face of the pressure container 12. A cylindrical outer magnet 38 is positioned on an outer periphery of the casing 36 so that the magnet is rotatable by means of a motor not shown. The outer magnet 38 is opposed to an inner magnet 32 of the rotatable shaft 34 through the casing 36. Consequently, as the outer magnet 38 rotates, the rotatable shaft 34 having the inner magnet 32 is rotated so that the rotatable table 30 is thus rotated. Further, as the outer magnet 38 is vertically moved, the rotatable shaft 34 with the inner magnet 32 is vertically moved so that the rotatable table 30 is vertically moved.

An outer container 42 includes an outer container main body 44 having a shape of a cylinder with a bottom plate and made of a metal, and an outer container lid 46 made of a metal and for closing an upper opening of the main body 44. A nitrogen gas introducing pipe 48 is fitted to the outer container lid 46 from a center of its bottom plane at an inclined angle toward the top. The nitrogen introducing pipe 48 is designed not to collide the nitrogen gas pipe 24, even when the outer container 42 is rotated and approached to the nitrogen gas pipe 24 by the minimum distance as the rotation of the rotatable table 30. Specifically, the minimum distance of the nitrogen introducing pipe 48 and nitrogen pipe 24 is designed to be several millimeters to several tens centimeters. The inner container 16 of FIG. 5 is mounted in the inside of the outer container main body 44.

That is, according to example of FIG. 5, two layers of the inner containers 16 are laminated. Each of the inner containers 16 includes a main body 16a and a lid 16b. A predetermined number, for example two, crucibles 14 are contained and laminated in an inner space of the container 16. Each of the crucibles 14 includes a main body 14a and a lid 14b, and materials of a melt 13 is charged into the main body 14a.

It will be described an example of use of the thus constituted system 10 of producing a crystal plate according to the present embodiment. The production system 10 is used for producing a nitride of group 3B by flux process. It will be described below the embodiment of producing a plate of gallium nitride as the crystal of nitride of group 3B element. In this case, a GaN template is prepared as the seed crystal substrate 11, gallium metal is prepared as the group 3B metal and sodium metal is prepared as the flux. The seed crystal substrate 11 is immersed in mixed melt containing the metal gallium and metal sodium in the crucible 14. While the rotatable table 30 is rotated and the heating space 16 is heated by the heaters 18a to 18d, pressurized nitrogen gas is supplied into the mixed melt so that gallium nitride crystal is grown on the seed crystal substrate in the mixed melt. It is preferred to add an appropriate amount of carbon into the mixed melt to prevent the formation of crystals by spontaneous nucleation. Crystals by spontaneous nucleation means gallium nitride crystallized at positions other than the seed crystal substrate. The thus grown gallium nitride crystal in the mixed melt in the crucible is cooled and then collected, by adding an organic solvent (for example, a lower alcohol such as methanol and ethanol) into the crucible to dissolve unnecessary matters such as the flux in the organic solvent.

In the case that gallium nitride crystal is produced as described above, the heating temperature is set under the boiling point of the mixed melt under the pressurized nitrogen gas containing atmosphere. Specifically, the heating temperature may preferably be set in a range of 700 to 1000° C. and more preferably be set in a range of 800 to 900° C. For making the temperature in the heating space 16 uniform, it is preferred to set the temperatures of the upper heater 18a, medium heater 18b, lower heater 18c and bottom heater 18d in the ascending order, or to set the temperatures of the upper heater 18a and medium heater 18b at the same temperature T1 and, at the same time, to set the temperatures of the lower heater 18c and the bottom heater 18d at a temperature T2 higher than the temperature T1. Further, the pressure of the pressurized nitrogen gas may preferably be made 1 to 7 MPa and more preferably be made 2 to 6 MPa. For adjusting the pressure of the pressurized nitrogen gas, the vacuum pump 26 is driven to make the inner pressure of the pressure container 12 high vacuum state (for example, 1 Pa or lower, or 0.1 Pa or lower) through the vacuum suction pipe 28. Thereafter, the vacuum suction pipe 28 is closed by means of a valve not shown and nitrogen gas is supplied into both inside and outside of the heater cover 14 through the nitrogen gas pipe 24 from the nitrogen gas bombe 22. During the growth of the gallium nitride crystal, the nitrogen gas is dissolved into the mixed melt and consumed and the pressure of nitrogen gas is lowered, so that nitrogen gas is supplied into the heating space 16 during the crystal growth by the mass flow controller 25 to maintain a predetermined flow rate. During the process, the branched pipe of the nitrogen gas pipe 24 communicating with the outside of the heater cover 14 is closed by a valve not shown. In the case that the pressure of the pressurized nitrogen gas atmosphere is not lowered, it is not necessary to flow the nitrogen gas.

According to the method of the present invention, it is preferred that the pressure of the pressurized atmosphere is set in a range of 1 to 7 MPa. A production system with lower pressure resistance can be thereby used compared with the case that the pressure is set at several hundreds MPa to realize the miniaturization and weight reduction.

Here, for rotating the container, the rotation direction of the container may be inverted or unidirectional. In the case that the rotation of the container is unidirectional, the rotational speed may be made 10 to 30 rpm, for example. Further, in the case that the rotational direction of the container is inverted, the rotational speed may be made 10 to 30 rpm, for example.

Further, for generating the inclusion distributed layer of the present invention, the rotation of the container may preferably be stopped. In this case, a time period of stopping the rotation may preferably be 100 to 6000 seconds and more preferably be 600 to 3600 seconds. Further, the time periods and rotational speed of rotating the container before and after the time period of stopping the rotation may preferably be 10 to 600 seconds and 10 to 30 rpm, respectively.

Further, by making the depth of the melt in the crucible 14 small, it is possible to facilitate the inclusion in the crystal in the initial stage. For this, as shown in FIG. 5, it is preferred to use a crucible 14 having a small height and to put the seed crystal substrate 11 horizontally on the bottom of the crucible in the melt. Further, it is preferred to laminate a plurality of the crucibles 14 each having a small height. Similarly, it is possible to facilitate the inclusion in the initial stage, by making an unsaturated time period before the crystal growth shorter. At the same time with these, by adjusting the rotational speed as described above, it is possible to prevent the generation of the inclusion after the initial stage of the growth is over. Besides, the unsaturated time period means a time period that the melt is not saturated yet and the crystal growth is not started.

Further, the ratio (molar ratio) of the nitride of group 13 element/flux (for example sodium) in the melt may preferably be higher on the viewpoint of the present invention, and preferably be 18 mol percent or higher and more preferably be 25 mol percent or higher. It is possible to facilitate the formation of the inclusions in the initial stage by increasing the molar ratio. However, since the crystal quality tends to be lower as the ratio becomes higher, the ratio may preferably be 40 mol percent or lower.

EXAMPLES

Inventive Example 1

The crystal production system shown in FIGS. 4 and 5 was used to produce gallium nitride crystal. The procedure will be described below. First, in a glove box filled with argon atmosphere, it is provided a seed crystal substrate (GaN template of φ 2 inches:GaN thin film (thickness of 5 microns) is formed on a sapphire substrate by MOCVD process) horizontally on a bottom of the crucible 14 having an inner diameter φ of 70 mm.

At this stage, the defect density at the surface of the GaN thin film was evaluated by CL (Cathode Luminescence) and proved to be about $8 \times 10^8$ to $2 \times 10^9/cm^2$.

Then, 15 g of sodium metal, 10 g of gallium metal and 39 mg of carbon (Ga/Na ratio was 18 mol %, C/Na ratio was 0.5 mol %) were charged into the crucible 14. The crucible 14 was contained in the inner container 16 made of stainless steel, and the inner container 16 was then contained in the outer container 14. An opening of the outer container main body was closed with the outer container lid equipped with the nitrogen introducing pipe. The outer container was then mounted on the rotatable table which was subjected to vacuum baking in advance, and the pressure container 12 was sealed with a lid.

Then, the inside of the pressure container was suctioned to vacuum with a vacuum pump to a pressure of 0.1 Pa or lower. Then, while the upper heater, medium heater, lower heater and bottom heater were adjusted at temperatures of 860° C., 860° C., 870° C. and 870° C., respectively, so that the temperature in the heating space reached 865° C., nitrogen gas was introduced from a nitrogen gas bombe to a pressure of 4.0 MPa and the outer container was rotated clockwise around a center axis at a rotation speed of 30 rpm. The acceleration time period "a" was 1 second, retention time period "b" was 15 seconds, deceleration time period "c" was 1 second, and stopping time period "d" was 2000 seconds. The container was held for 10 hours under these conditions. Thereafter, the container was naturally cooled to room temperature, and the lid of the pressure container was opened to draw the crucible from the inside. Ethanol was then charged into the crucible to dissolve the sodium metal in the ethanol, and the grown gallium nitride crystal plate was collected. The gallium nitride had a size of φ 2 inches and was grown on the seed crystal substrate by a thickness of about 0.1 mm. Therefore, the average growth rate of the crystal was estimated as about 10 μm/hr.

Besides, the depth of the melt was about 4 mm, and the unsaturated time period was about 2 hours.

Figure 6:
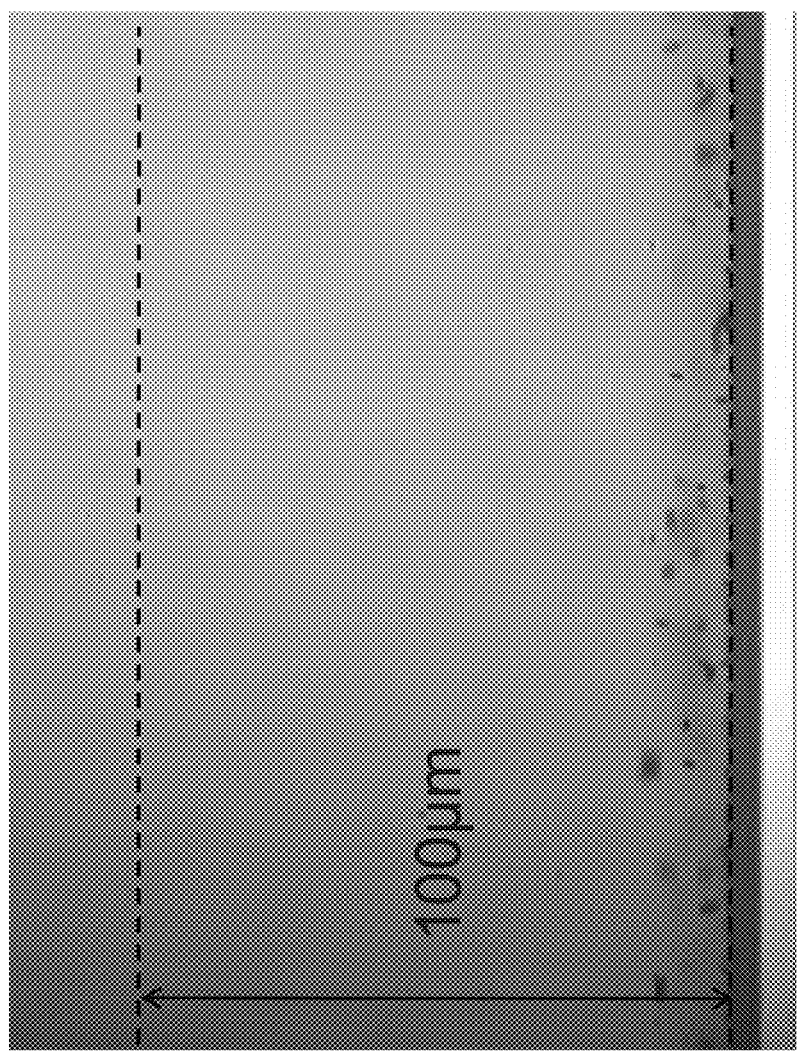
FIG. 6 is a microscopic photograph of a nitride single crystal obtained in example 1.
Figure 14:
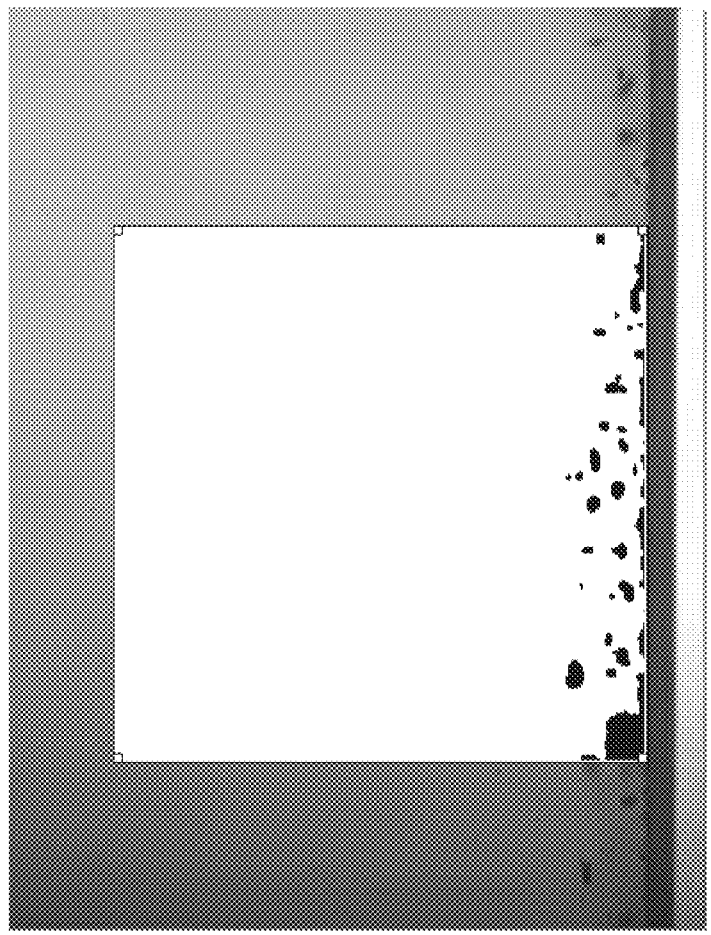
FIG. 14 is an image obtained by binarization of the microscopic photograph obtained in the example 1.

The cross section of the thus grown crystal was observed and the results were shown in FIG. 6. FIG. 14 shows binarized image thereof. As can be seen form the figures, it was proved that inclusions each having a size of several microns in a region distant from the interface by 20 μm or smaller were present in the initial stage of growth. The inclusions were subjected to SIMS analysis to detect sodium and gallium.

Further, the ratio of the area of the inclusions in each layer was shown in table 1. Further, table 2 shows the area of the inclusion having the largest area. Besides, the ratio of the area of the inclusions in the region distant from the interface by 50 µm or smaller was proved to be about 4 percent, and the ratio of the area of the inclusions in the inclusion depleted layer distant from the interface by more than 50 µm was proved to be about 0 percent.

The thus grown region was polished to a thickness of 70 µm and the total thickness of the substrate was adjusted to 0.4 mm. The defect density at the surface was evaluated by CL (Cathode Luminescence) to prove to be the order of $10^5$ to $10^6/cm^2$, which was considerably lowered than the defect density of the seed crystal substrate.

Inventive Example 2

The gallium nitride film was formed according to the same procedure as the Inventive Example 1. However, the rotational direction was periodically inverted. Further, the acceleration time period was 1 second, retention time period was 15 seconds, deceleration time period was 1 second, and stopping time period was 3000 seconds, and the inversion of the rotational direction was repeated.

Figure 7:
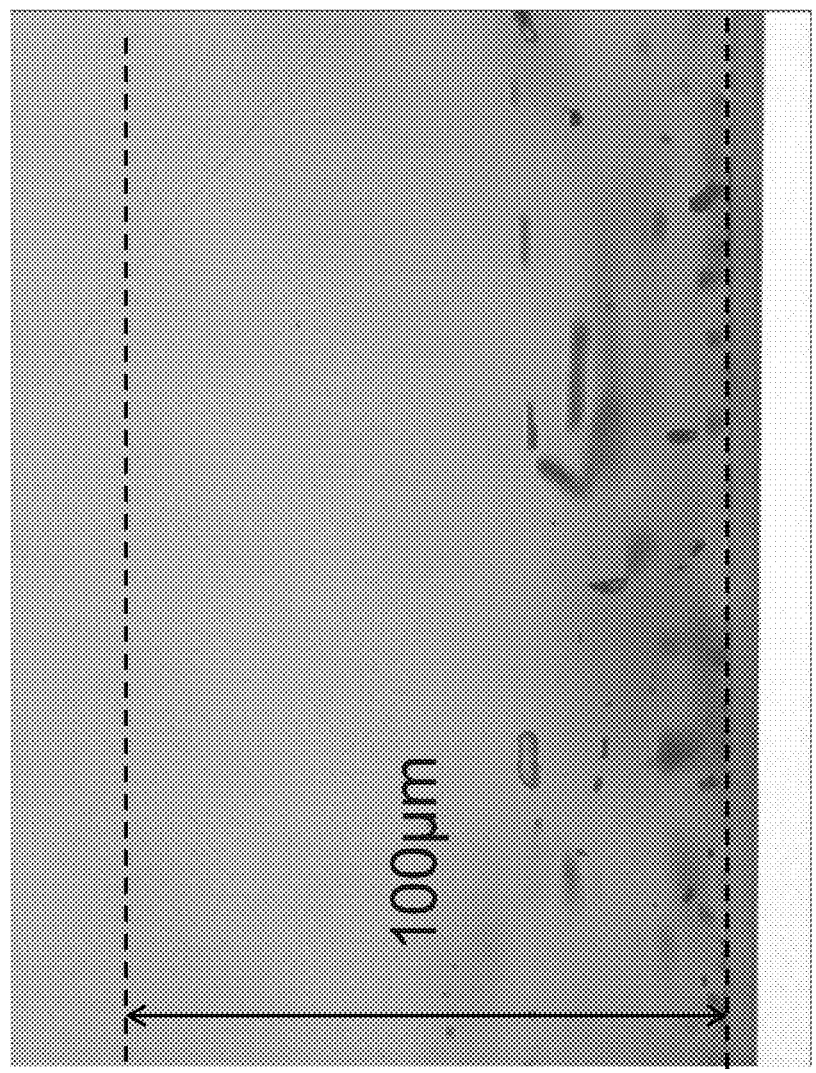
FIG. 7 is a microscopic photograph of a nitride single crystal obtained in example 2.
Figure 15:
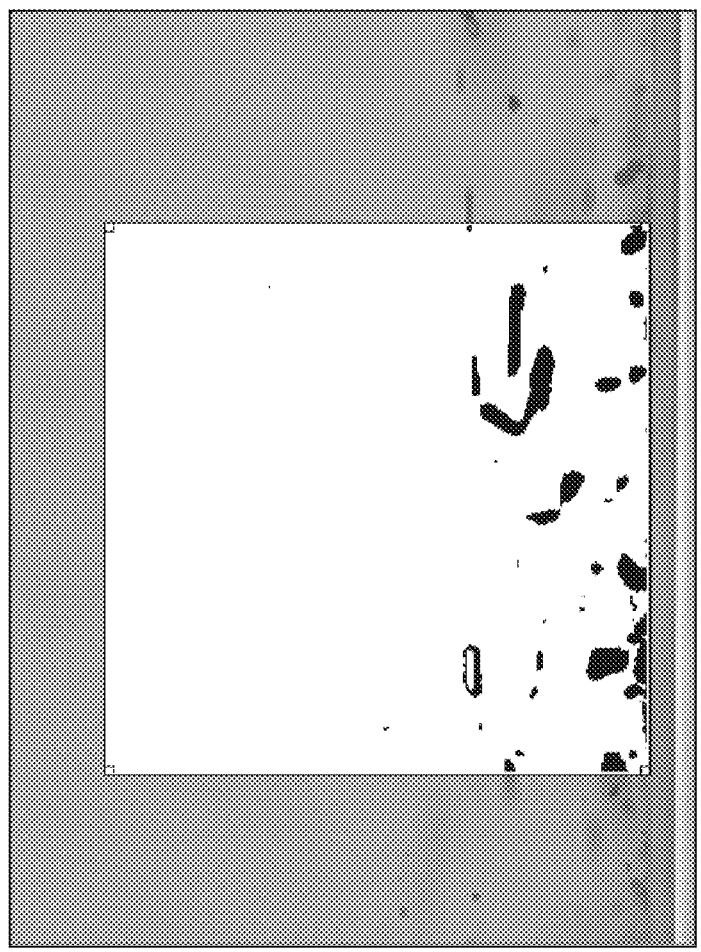
FIG. 15 is an image obtained by binarization of the microscopic photograph obtained in the example 2.

The cross section of the thus grown crystal was observed and the results were shown in FIG. 7. FIG. 15 shows the binarized image thereof. As can be seen form the figures, it was proved that inclusions each having a size of several microns were present in a region distant from the interface by 40 µm or smaller in the initial stage of growth. The inclusions were subjected to SIMS analysis to detect sodium and gallium. Further, the ratio of the area of the inclusions in each layer was shown in table 1. Besides, the ratio of the area of the inclusions in the region distant from the interface by 50 µm or smaller was proved to be about 8 percent, and the ratio of the area of the inclusions in the inclusion depleted layer distant from the interface by more than 50 µm was proved to be about 0 percent.

The thus grown region was polished to a thickness of 70 µm and the total thickness of the substrate was adjusted to 0.4 mm. The defect density at the surface was evaluated by CL (Cathode Luminescence) to prove to be the order of $10^5$ to $10^6/cm^2$, which was considerably lowered than the defect density of the seed crystal substrate.

Inventive Example 3

The gallium nitride film was formed according to the same procedure as the Inventive Example 1. However, the rotational direction was periodically inverted. Further, the acceleration time period was 1 second, retention time period was 15 seconds, deceleration time period was 1 second, and stopping time period was 3000 seconds, and the inversion of the rotational direction was repeated. The rotation speed was made 10 rpm.

Figure 8:
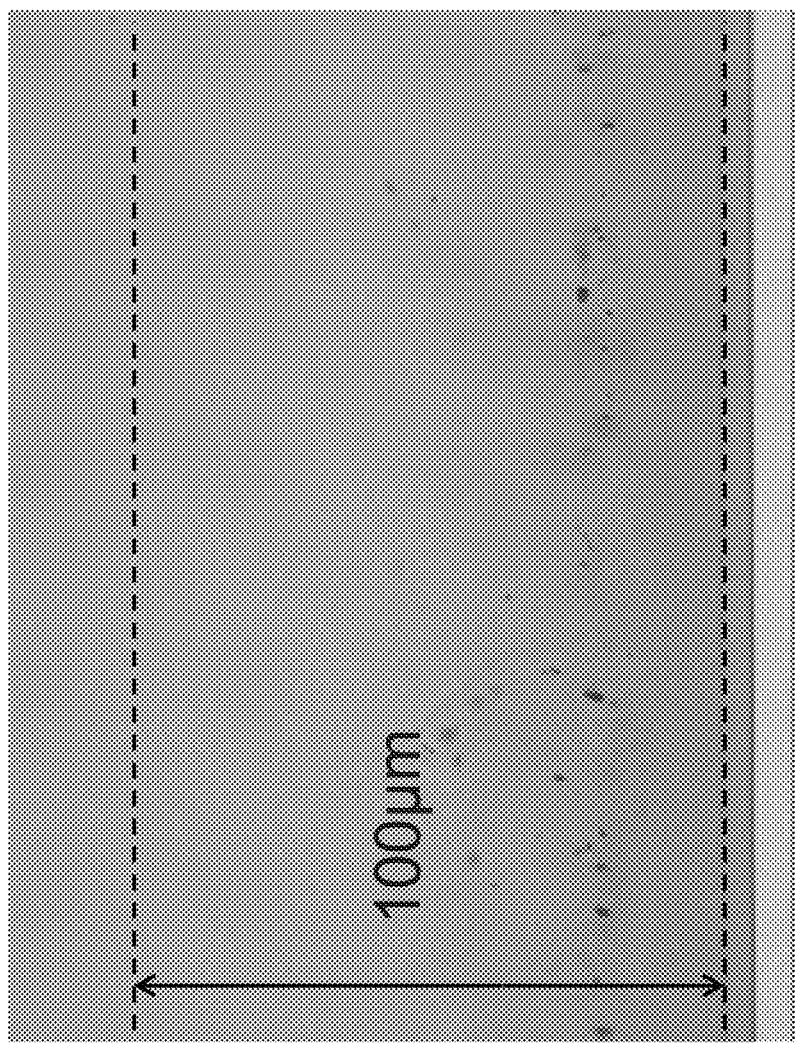
FIG. 8 is a microscopic photograph of a nitride single crystal obtained in example 3.
Figure 16:
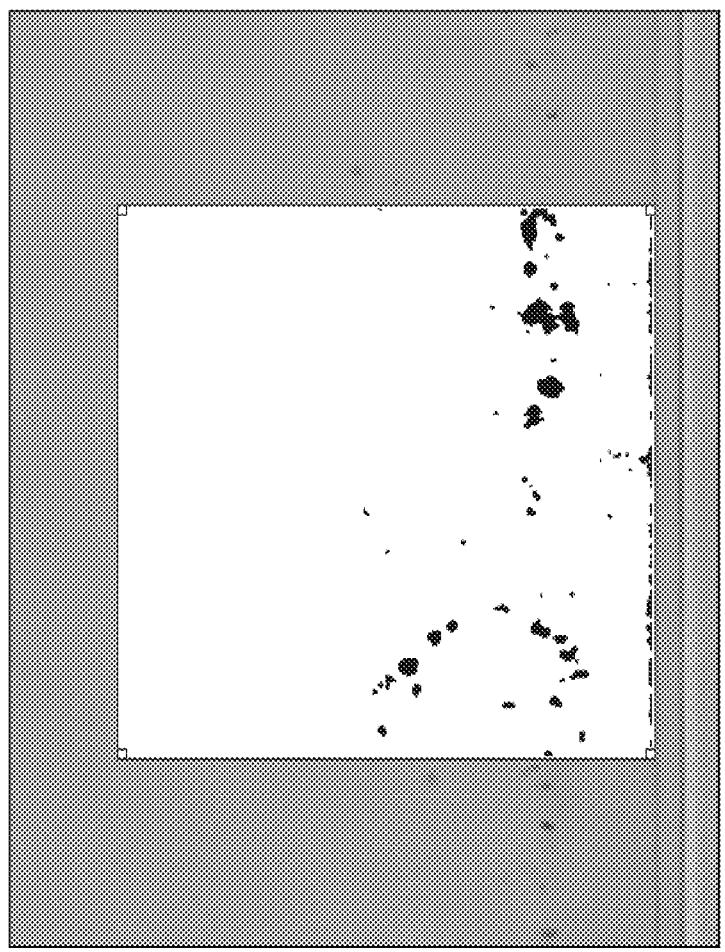
FIG. 16 is an image obtained by binarization of the microscopic photograph obtained in the example 3.

The cross section of the thus grown crystal was observed and the results were shown in FIG. 8. FIG. 16 shows the binarized image thereof. As can be seen form the figures, it was proved that inclusions each having a size of several microns were present in a region distant from the interface by 50 µm or smaller in the initial stage of growth. The inclusions were subjected to SIMS analysis to detect sodium and gallium. Further, the ratio of the inclusions in each layer was shown in table 1. Besides, the ratio of the area of the inclusions in the region distant from the interface by 50 µm or smaller was proved to be about 2 percent, and the ratio of the area of the inclusions in the inclusion depleted layer distant from the interface by more than 50 µm was proved to be about 0 percent.

The thus grown region was polished to a thickness of 70 µm and the total thickness of the substrate was adjusted to 0.4 mm. The defect density of the surface was evaluated by CL (Cathode Luminescence) to prove to be the order of $10^5$ to $10^6/cm^2$, which was considerably lowered than the defect density of the seed crystal substrate.

Inventive Example 4

The gallium nitride film was formed according to the same procedure as the Example 1. However, the rotational direction was clockwise only and the rotational speed was made 30 rpm. Further, the amounts of sodium metal, gallium metal and carbon were made 13.5 g, 18 g and 35 mg, respectively, and Ga/Na ratio was made 30 mol %.

Figure 9:
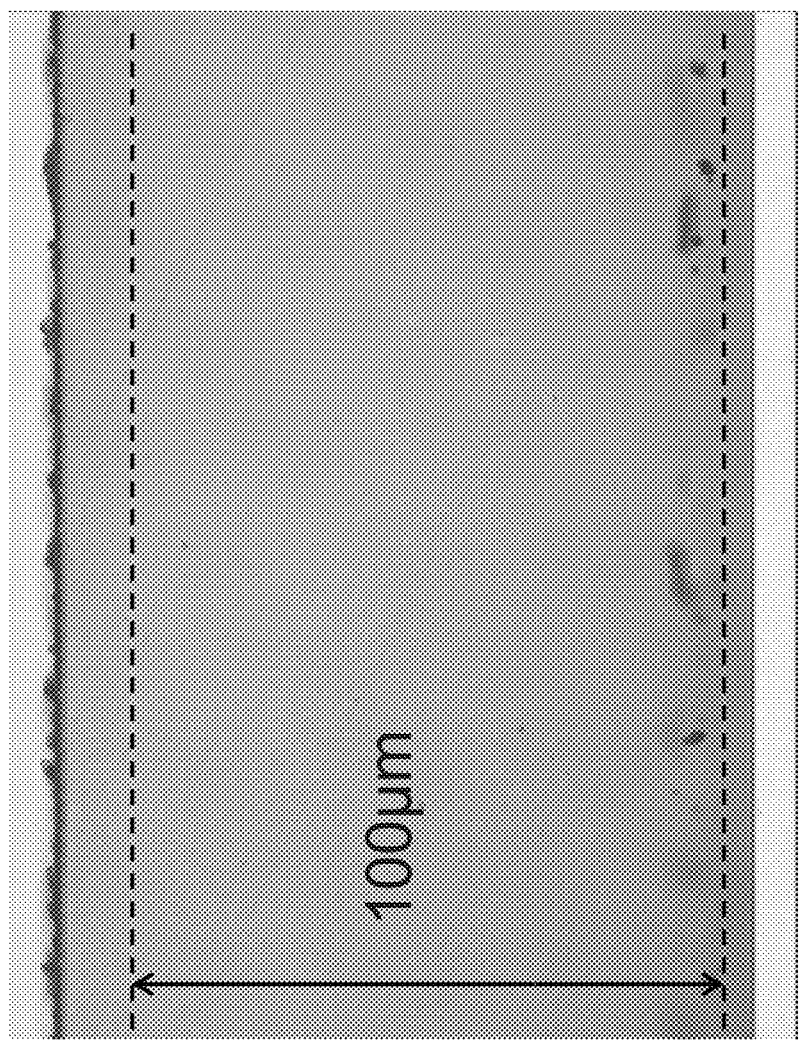
FIG. 9 is a microscopic photograph of a nitride single crystal obtained in example 4.
Figure 17:
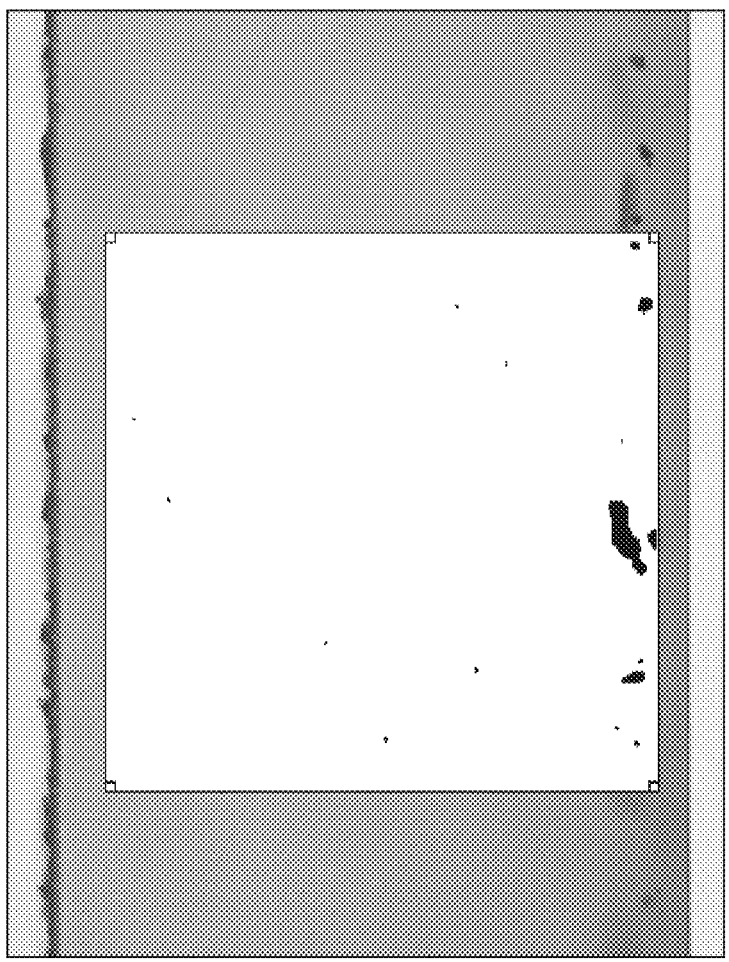
FIG. 17 is an image obtained by binarization of the microscopic photograph obtained in the example 4.

The cross section of the thus grown crystal was observed and the results were shown in FIG. 9. FIG. 17 shows the binarized image thereof. As can be seen form the figures, it was proved that inclusions each having a size of several microns were present in a region distant from the interface by 10 µm or smaller in the initial stage of growth. The inclusions were subjected to SIMS analysis to detect sodium and gallium. The ratio of the inclusions in each layer was shown in table 1. Besides, the ratio of the area of the inclusions in the region distant from the interface by 50 µm or smaller was proved to be about 7 percent, and the ratio of the area of the inclusions in the inclusion depleted layer distant from the interface by more than 50 µm was proved to be about 0 percent.

The thus grown region was polished to a thickness of 70 µm and the total thickness of the substrate was adjusted to 0.4 mm. The defect density of the surface was evaluated by CL (Cathode Luminescence) to prove to be the order of $10^5$ to $10^6/cm^2$, which was considerably lowered than the defect density of the seed crystal substrate.

Inventive Example 5

The gallium nitride film was formed according to the same procedure as the Inventive Example 1. However, the amounts of sodium metal, gallium metal and carbon were made 13.5 g, 18 g and 35 mg, respectively, and Ga/Na ratio was made 30 mol %.

Figure 10:
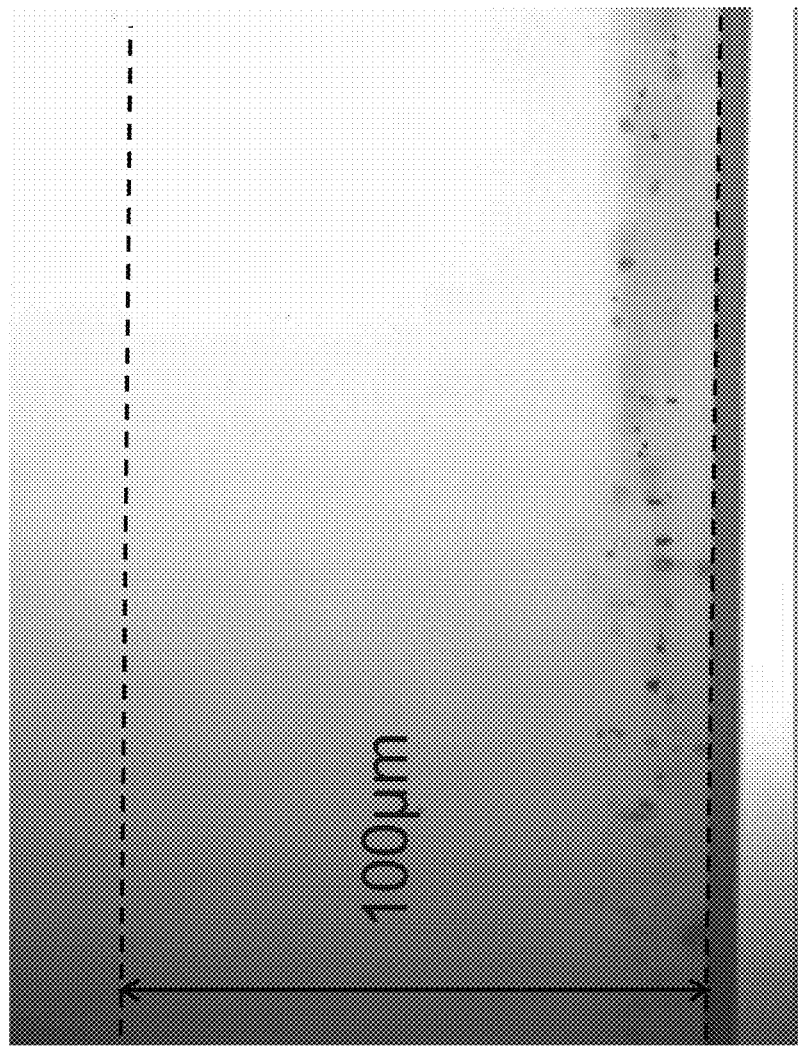
FIG. 10 is a microscopic photograph of a nitride single crystal obtained in example 5.
Figure 18:
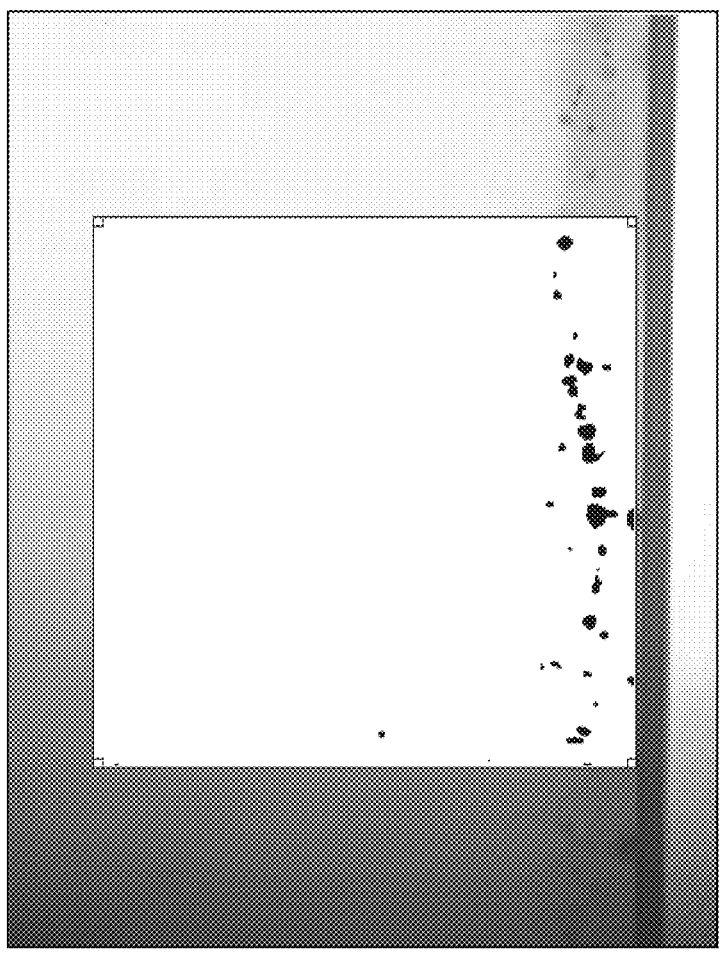
FIG. 18 is an image obtained by binarization of the microscopic photograph obtained in the example 5.

The cross section of the thus grown crystal was observed and the results were shown in FIG. 10. FIG. 18 shows the binarized image thereof. As can be seen form the figures, it was proved that inclusions each having a size of several microns were present in a region distant from the interface by 20 µm or smaller in the initial stage of growth. That is, the areas of the inclusions were 20 µm$^2$ or lower. The inclusions were subjected to SIMS analysis to detect sodium and gallium. The ratio of the inclusions in each layer was shown in table 1. Besides, the ratio of the area of the inclusions in the region distant from the interface by 25 µm or smaller was proved to be about 8 percent, and the ratio of the area of the inclusions in the upper inclusion depleted layer more distant from the interface was proved to be about 0 percent.

The thus grown region was polished to a thickness of 70 µm and the total thickness of the substrate was adjusted to 0.4 mm. The defect density at the surface was evaluated by CL (Cathode Luminescence) to prove to be the order of $10^5$ to $10^6/cm^2$, which was considerably lowered than the defect density of the seed crystal substrate.

Comparative Example 1

The gallium nitride film was formed according to the same procedure as the Inventive Example 1. However, the amounts of sodium metal, gallium metal and carbon were made 10 g, 5 g and 39 mg, respectively, and Ga/Na ratio was made 10 mol %. Further, the rotation was not stopped and the container was continuously rotated for 15 hours clockwise at a speed of 30 rpm to grow the crystal. The thus obtained gallium nitride crystal plate had a size of φ 2 inches and grown on the seed crystal substrate by about 0.1 mm. The average crystal growth rate can thus be estimated as about 6.7 μm/hr.

Figure 11:
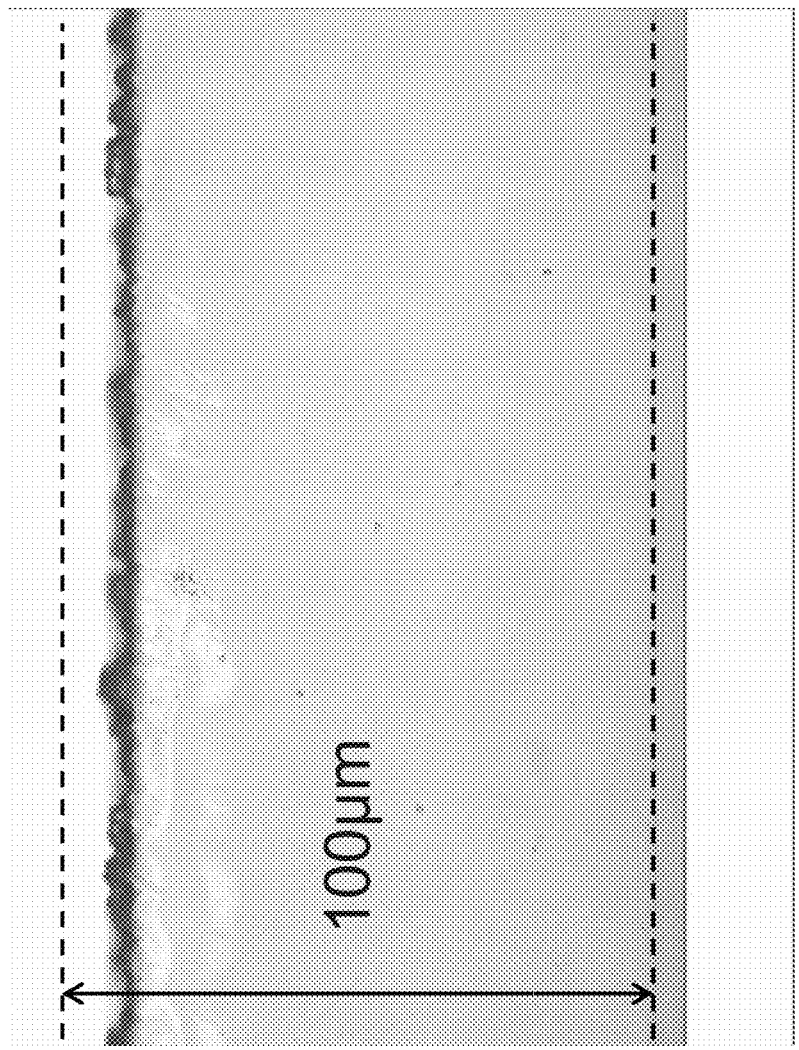
FIG. 11 is a microscopic photograph of a nitride single crystal obtained in comparative example 1.
Figure 19:
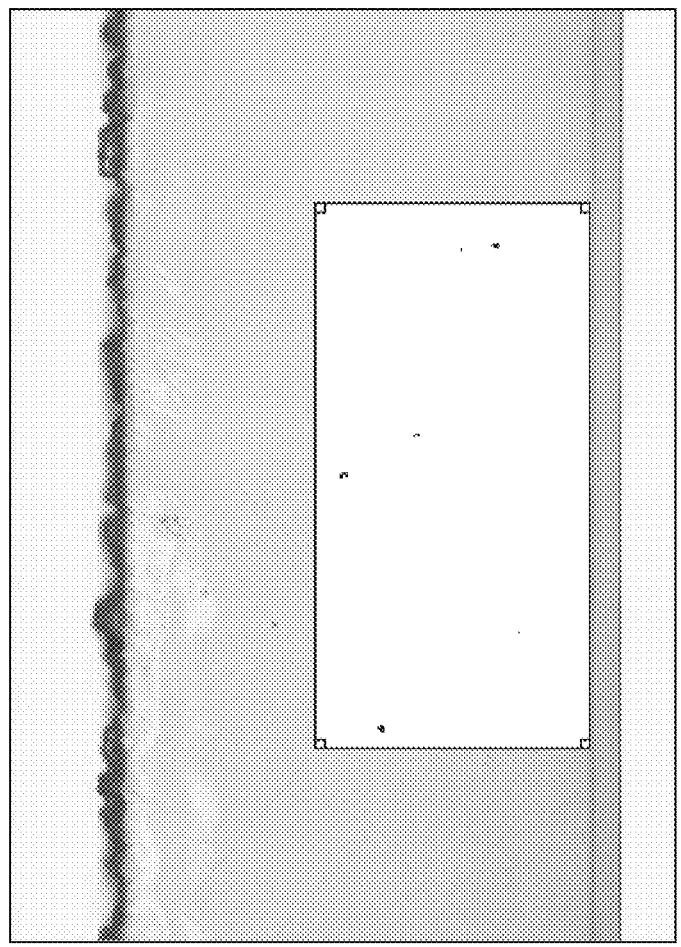
FIG. 19 is an image obtained by binarization of the microscopic photograph obtained in the comparative example 1.

The cross section of the thus grown crystal was observed and the results were shown in FIG. 11. FIG. 19 shows the binarized image thereof. As can be seen form the figures, it was proved that inclusions were not observed in a region distant from the interface by 50 μm or smaller in the initial stage of growth.

The thus grown region was polished to a thickness of 70 μm and the total thickness of the substrate was adjusted to 0.4 mm. The defect density at the surface was evaluated by CL (Cathode Luminescence) to prove to be the order of $10^7/cm^2$. Although it was considerably lowered than the defect density of the seed crystal substrate, the defect density was higher than that in the Inventive Example 1.

Comparative Example 2

The gallium nitride film was formed according to the same procedure as the Inventive Example 1. However, the rotation was not stopped and the container was continuously rotated for 15 hours clockwise at a speed of 30 rpm to grow the crystal. The thus obtained gallium nitride crystal plate had a size of φ 2 inches and grown on the seed crystal substrate by about 0.1 mm.

Figure 12:
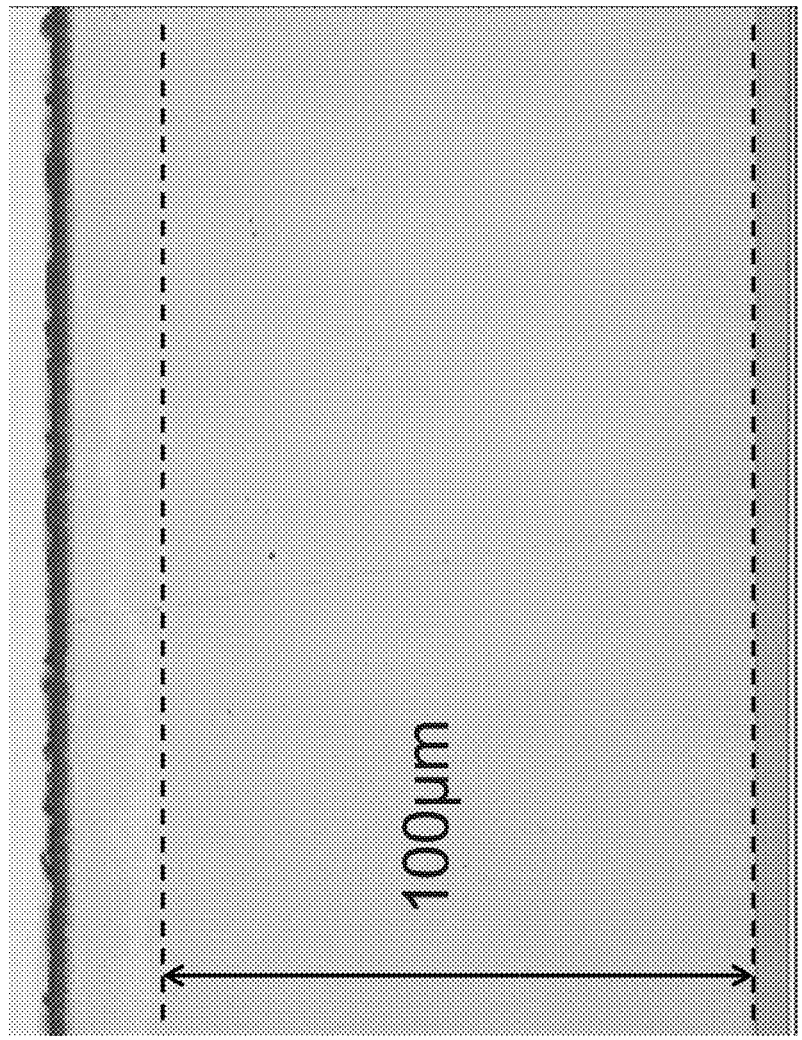
FIG. 12 is a microscopic photograph of a nitride single crystal obtained in comparative example 2.
Figure 20:
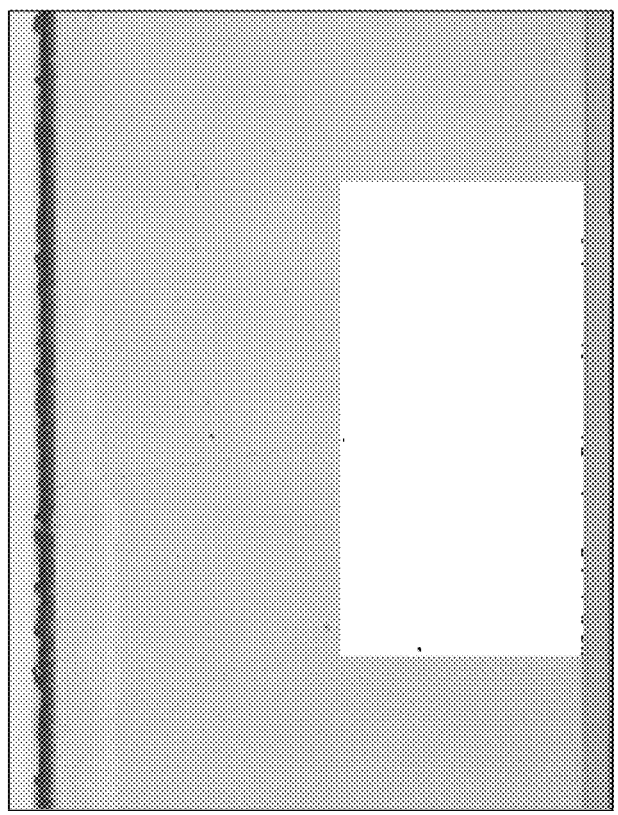
FIG. 20 is an image obtained by binarization of the microscopic photograph obtained in the comparative example 2.

The cross section of the thus grown crystal was observed and the results were shown in FIG. 12. FIG. 20 shows the binarized image thereof. As can be seen form the figures, it was proved that inclusions were not observed in a region distant from the interface by 50 μm or smaller in the initial stage of growth.

The thus grown region was polished to a thickness of 70 μm and the total thickness of the substrate was adjusted to 0.4 mm. The defect density at the surface was evaluated by CL (Cathode Luminescence) to prove to be the order of $10^7/cm^2$. Although it was considerably lowered than the defect density of the seed crystal substrate, the defect density was higher than that in the Inventive Example 1.

Comparative Example 3

The gallium nitride film was formed according to the same procedure as the Inventive Example 1. However, the amounts of sodium metal, gallium metal and carbon were made 13.5 g, 18 g and 35 mg, respectively, and Ga/Na ratio was made 30 mol %. Further, the rotational direction was periodically inverted and the rotational speed was made 10 rpm. The thus obtained gallium nitride crystal plate had a size of φ 2 inches and grown on the seed crystal substrate by about 0.1 mm.

Figure 13:
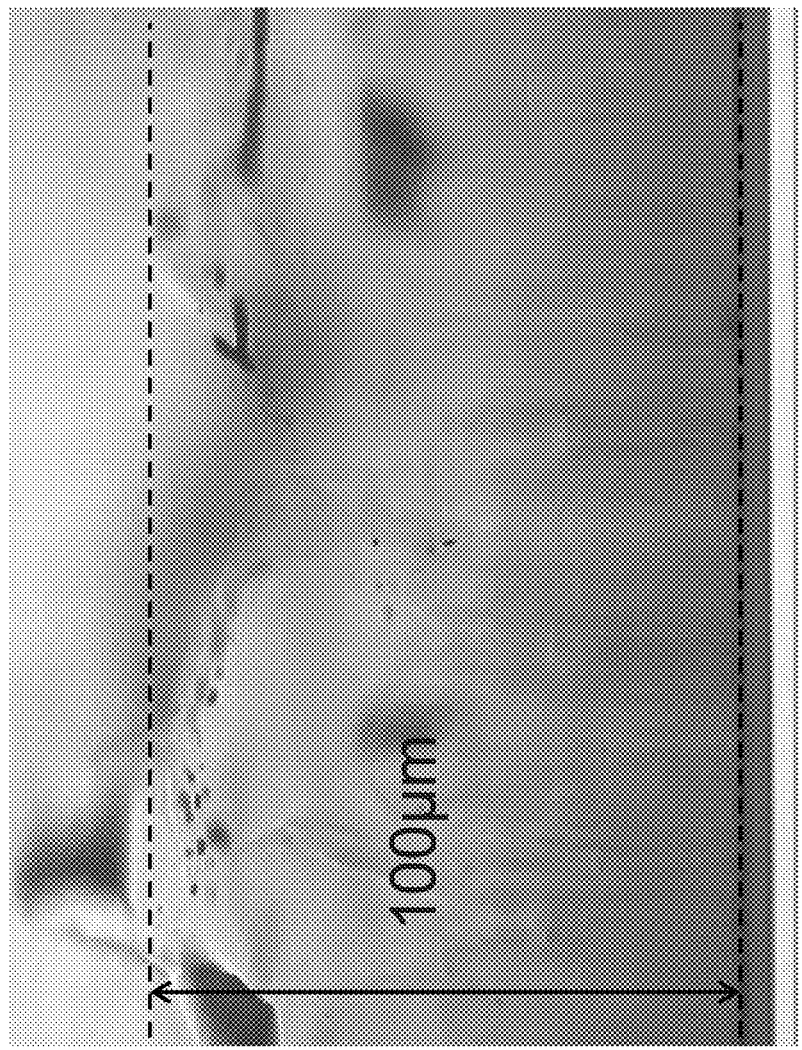
FIG. 13 is a microscopic photograph of a nitride single crystal obtained in comparative example 3.
Figure 21:
FIG. 21 is an image obtained by binarization of the microscopic photograph obtained in the comparative example 3.

The cross section of the thus grown crystal was observed and the results were shown in FIG. 13. FIG. 21 shows the binarized image thereof. As can be seen form the figures, it was proved that large inclusions were present in a region distant from the interface by 50 μm or smaller in the initial stage of growth. The inclusions were subjected to SIMS analysis to detect sodium and gallium. Further, the ratio of the area of the inclusions in the region distant from the interface by 50 μm or smaller was proved to be about 20 percent, and the ratio of the area of the inclusions in the upper layer more distant from the interface was proved to be about 20 percent.

The thus grown region was polished to a thickness of 80 μm and the total thickness of the substrate was adjusted to 0.4 mm. The defect density at the surface was evaluated by CL (Cathode Luminescence) to prove to be the order of $10^7/cm^2$.

TABLE 1

Relationship between grown thickness and ratio of area of inclusions

| Grown thickness μm | Inv. Ex. 1 | Inv. Ex. 2 | Inv. Ex. 3 | Inv. Ex. 4 | Inv. Ex. 5 | Com. Ex. 1 | Com. Ex. 2 | Com. Ex. 3 |
|---|---|---|---|---|---|---|---|---|
| 0~10 | 17 | 18 | 10 | 7 | 6 | 0 | 0 | 23 |
| 10~20 | 2 | 7 | 7 | 0 | 7 | 0 | 0 | 2 |
| 20~30 | 0 | 10 | 7 | 0 | 0 | 0 | 0 | 5 |
| 30~40 | 0 | 3 | 2 | 0 | 0 | 0 | 0 | 6 |
| 40~50 | 0 | 0 | 2 | 0 | 0 | 0 | 0 | 2 |
| 50~60 | 0 | 0 | 0 | 0 | 0 | 0 | 0 | 8 |
| 60~70 | 0 | 0 | 0 | 0 | 0 | 0 | 0 | 8 |
| 70~80 | 0 | 0 | 0 | 0 | 0 | 0 | 0 | 6 |
| 80~90 | 0 | 0 | 0 | 0 | 0 | — | 0 | 6 |
| 90~100 | 0 | 0 | 0 | 0 | 0 | — | 0 | 6 |
| 100~ | 0 | 0 | 0 | 0 | 0 | — | 0 | 5 |

TABLE 2

Maximum area of inclusions

| | Inv. Ex. 1 | Inv. Ex. 2 | Inv. Ex. 3 | Inv. Ex. 4 | Inv. Ex. 5 |
|---|---|---|---|---|---|
| Maximum inclusion size (μm$^2$) | 30 | 60 | 20 | 60 | 20 |

| | Com. Ex. 1 | Com. Ex. 2 | Com. Ex. 3 |
|---|---|---|---|
| Maximum inclusion size (μm$^2$) | 5 | 1 | 150 |

Next, they were variously changed the ratio of the thickness of the inclusion distributed layer and that of the inclusion depleted layer to study its relationship with the warping of the film.

Besides, a laser interferometer was used to measure distribution of heights with respect to the back face of the film, and a difference of the heights of the highest point and lowest point is defined as "warping". Positive warping corresponds to the shape that the surface is protruded and negative warping corresponds to the shape that the surface is recessed. The film surface was protruded in the following inventive and comparative examples.

Inventive Example 6

The gallium nitride film was formed according to the same procedure as the Inventive Example 1. However, the holding time period for the growth was 12 hours. The thus obtained gallium nitride crystal had a size of φ 2 inches and grown on the seed crystal substrate by about 0.125 mm.

Cross section of the thus grown crystal was observed to prove that there was the inclusion distributed layer in a region distant from the interface by 25 μm or smaller in the initial stage of the growth. Therefore, the thickness of the inclusion depleted layer is 4, provided that 1 is assigned to the thickness of the inclusion distributed layer. Further, the warping of the gallium nitride crystal plate was measured from the side of the sapphire substrate on the back face to prove that the warping was 130 μm.

Wax was applied onto the sapphire side, which was then adhered onto a surface plate by pressing to prove that the deviation of the thickness of the wax can be reduced to less than 10 μm. The grown GaN was polished to a thickness of 70 μm and the sapphire was also polished so that the total thickness of the substrate was adjusted to 0.9 mm to obtain a wafer. The warping of the wafer was proved to be 50 μm. Further, the defect density at the surface of GaN was evaluated by CL (Cathode Luminescence) to prove to be the order of $10^5$ to $10^6/cm^2$, which was considerably lower than the defect density of the seed crystal. Further, the GaN was subjected to SIMS analysis to prove that the oxygen content was $1 \times 10^{17}/cm^3$ and Si content was $6 \times 10^{16}/cm^3$, respectively. As a result of hole measurement, it was proved to be n-type with a specific resistance of about 0.1 Ωcm.

A blue color LED was fabricated on this wafer by MOCVD process. Specifically, after n-GaN layer having a thickness of 2 μm was formed, it was produced 7 periods of quantum well structures each having InGaN layer with a thickness of 3 nm and GaN layer with a thickness of 5 nm. p-GaN layer with a thickness of 50 nm was then formed thereon. The p-GaN side of the wafer was adhered onto a conductive silicon wafer with a thickness of 0.3 mm by metal bonding. A commercial laser lift-off system was used to irradiate laser ray from the sapphire side to separate the sapphire substrate from the GaN. The N face of the thus separated GaN was exposed. The N face was subjected to moth eye processing for improving light extraction efficiency, n electrode was then fitted thereto, and then cut into a size of 1 mm×1 mm to produce LED chips. During the moth eye processing, the inclusion distributed layer was removed. The LED chip was mounted on a heat sink, an phosphor was applied thereon and the chip was then driven at 350 mA to prove to emit light at a high efficiency of 100 lumen/W or higher.

Inventive Example 7

The gallium nitride film was formed according to the same procedure as the Inventive Example 1. However, the upper heater, medium heater, lower heater and bottom heater were adjusted at temperatures of 880° C., 880° C., 890° C. and 890° C., respectively, so that the temperature in the heating space reached 885° C. The container was held for 4 hours under these conditions. The gallium nitride had a size of ϕ 2 inches and grown on the seed crystal substrate by a thickness of about 0.025 mm.

As a result of observing the cross section of the thus grown crystal, it was proved that the inclusion distributed layer was formed in a region distant from the interface by 3 μm or smaller in the initial stage of growth. Therefore, the thickness of the inclusion depleted layer is 22/3 provided when that of the thickness of the inclusion distributed layer is assigned to 1.

Further, the warping of the gallium nitride crystal plate was measured from the side of the sapphire substrate on the back face to prove that the warping was 38 μm.

Inventive Example 8

The gallium nitride film was formed according to the same procedure as the Inventive Example 7. However, the container was held for 10 hours. The gallium nitride had a size of ϕ 2 inches and grown on the seed crystal substrate by a thickness of about 0.105 mm.

As a result of observing the cross section of the thus grown crystal, it was proved that the inclusion distributed layer was formed in a region distant from the interface by 5 μm or smaller in the initial stage of growth. Therefore, the thickness of the inclusion depleted layer is 20, provided when that of the thickness of the inclusion distributed layer is assigned to 1.

Further, the warping of the gallium nitride crystal plate was measured from the side of the sapphire substrate on the back face to prove that the warping was 155 μm.

Inventive Example 9

The gallium nitride film was formed according to the same procedure as the Inventive Example 7. However, the container was held for 12 hours. The gallium nitride had a size of ϕ 2 inches and grown on the seed crystal substrate by a thickness of about 0.127 mm.

As a result of observing the cross section of the thus grown crystal, it was proved that the inclusion distributed layer was formed in a region distant from the interface by 7 μm or smaller in the initial stage of growth. Therefore, the thickness of the inclusion depleted layer is 17, provided when that of the thickness of the inclusion distributed layer is assigned to 1.

Further, the warping of the gallium nitride crystal plate was measured from the side of the sapphire substrate on the back face to prove that the warping was 180 μm.

Inventive Example 10

The gallium nitride film was formed according to the same procedure as the Inventive Example 4. However, the container was held for 6 hours. The gallium nitride had a size of ϕ 2 inches and grown on the seed crystal substrate by a thickness of about 0.030 mm.

As a result of observing the cross section of the thus grown crystal, it was proved that the inclusion distributed layer was formed in a region distant from the interface by 20 μm or smaller in the initial stage of growth. Therefore, the thickness of the inclusion depleted layer is 0.5, provided when that of the thickness of the inclusion distributed layer is assigned to 1.

Further, the warping of the gallium nitride crystal plate was measured from the side of the sapphire substrate on the back face to prove that the warping was 70 μm.

Inventive Example 11

The gallium nitride film was formed according to the same procedure as the Inventive Example 1. However, the container was held for 12 hours. The gallium nitride had a size of ϕ 2 inches and grown on the seed crystal substrate by a thickness of about 0.110 mm.

As a result of observing the cross section of the thus grown crystal, it was proved that the inclusion distributed layer was formed in a region distant from the interface by 30 μm or smaller in the initial stage of growth. Therefore, the thickness of the inclusion depleted layer is 8/3, provided when that of the thickness of the inclusion distributed layer is assigned to 1.

Further, the warping of the gallium nitride crystal plate was measured from the side of the sapphire substrate on the back face to prove that the warping was 130 μm.

Inventive Example 12

The gallium nitride film was formed according to the same procedure as the Inventive Example 1. However, the container was held for 20 hours. The gallium nitride had a size of ϕ 2 inches and grown on the seed crystal substrate by a thickness of about 0.220 mm.

As a result of observing the cross section of the thus grown crystal, it was proved that the inclusion distributed layer was formed in a region distant from the interface by 20 μm or smaller in the initial stage of growth. Therefore, the thickness of the inclusion depleted layer is 10, provided when that of the thickness of the inclusion distributed layer is assigned to 1.

Further, the warping of the gallium nitride crystal plate was measured from the side of the sapphire substrate on the back face to prove that the warping was 320 μm.

Inventive Example 13

The gallium nitride film was formed according to the same procedure as the Inventive Example 1. However, the upper heater, medium heater, lower heater and bottom heater were adjusted at temperatures of 870° C., 870° C., 880° C. and 880° C., respectively, so that the temperature in the heating space reached 875° C. The container was held for 10 hours under these conditions. The gallium nitride had a size of φ 2 inches and grown on the seed crystal substrate by a thickness of about 0.100 mm.

As a result of observing the cross section of the thus grown crystal, it was proved that the inclusion distributed layer was formed in a region distant from the interface by 10 μm or smaller in the initial stage of growth. Therefore, the thickness of the inclusion depleted layer is 9, provided when that of the thickness of the inclusion distributed layer is assigned to 1.

Further, the warping of the gallium nitride crystal plate was measured from the side of the sapphire substrate on the back face to prove that the warping was 130 μm.

Comparative Example 4

The gallium nitride film was formed according to the same procedure as the Comparative Example 1. However, the container was held for 15 hours. The gallium nitride had a size of φ 2 inches and grown on the seed crystal substrate by a thickness of about 0.150 mm.

As a result of observing the cross section of the thus grown crystal, it was proved that inclusions were not observed in a region distant from the interface by 50 μm or smaller in the initial stage of growth.

Further, the warping of the gallium nitride crystal plate was measured from the side of the sapphire substrate on the back face to prove that the warping was 250 μm.

Comparative Example 5

The gallium nitride film was formed according to the same procedure as the Comparative Example 1. However, the container was held for 5 hours. The gallium nitride had a size of φ 2 inches and grown on the seed crystal substrate by a thickness of about 0.050 mm.

As a result of observing the cross section of the thus grown crystal, it was proved that inclusions were not observed in a region distant from the interface by 50 μm or smaller in the initial stage of growth.

Further, the warping of the gallium nitride crystal plate was measured from the side of the sapphire substrate on the back face to prove that the warping was 85 μm.

Comparative Example 6

The gallium nitride film was formed according to the same procedure as the Comparative Example 1. However, the container was held for 20 hours. The gallium nitride had a size of φ 2 inches and grown on the seed crystal substrate by a thickness of about 0.200 mm.

As a result of observing the cross section of the thus grown crystal, it was proved that inclusions were not observed in a region distant from the interface by 50 μm or smaller in the initial stage of growth.

Further, the warping of the gallium nitride crystal plate was measured from the side of the sapphire substrate on the back face to prove that the warping was 340 μm.

Comparative Example 7

The gallium nitride film was formed according to the same procedure as the Inventive Example 1. However, the upper heater, medium heater, lower heater and bottom heater were adjusted at temperatures of 850° C., 850° C., 860° C. and 860° C., respectively, so that the temperature in the heating space reached 855° C. The container was held for 10 hours under these conditions. The gallium nitride had a size of φ 2 inches and grown on the seed crystal substrate by a thickness of about 0.100 mm.

As a result of observing the cross section of the thus grown crystal, it was proved that inclusions were distributed in a region distant from the interface by 50 μm or smaller in the initial stage of growth, as well as in a region distant from the interface by 50 to 60 μm. The ratio of the area of the inclusions in a region distant from the interface by 50 μm or smaller was proved to be about 4 percent, and the ratio of the area of the inclusions in a region distant from the interface by 50 to 60 μm was proved to be about 3 percent.

Further, the gallium nitride crystal plate was used to form an LED structure. As a result, abnormal growth was observed in the inclusion-containing area and the surface morphology became rough, so that production of the LED was failed.
(Evaluation)

Figure 22:
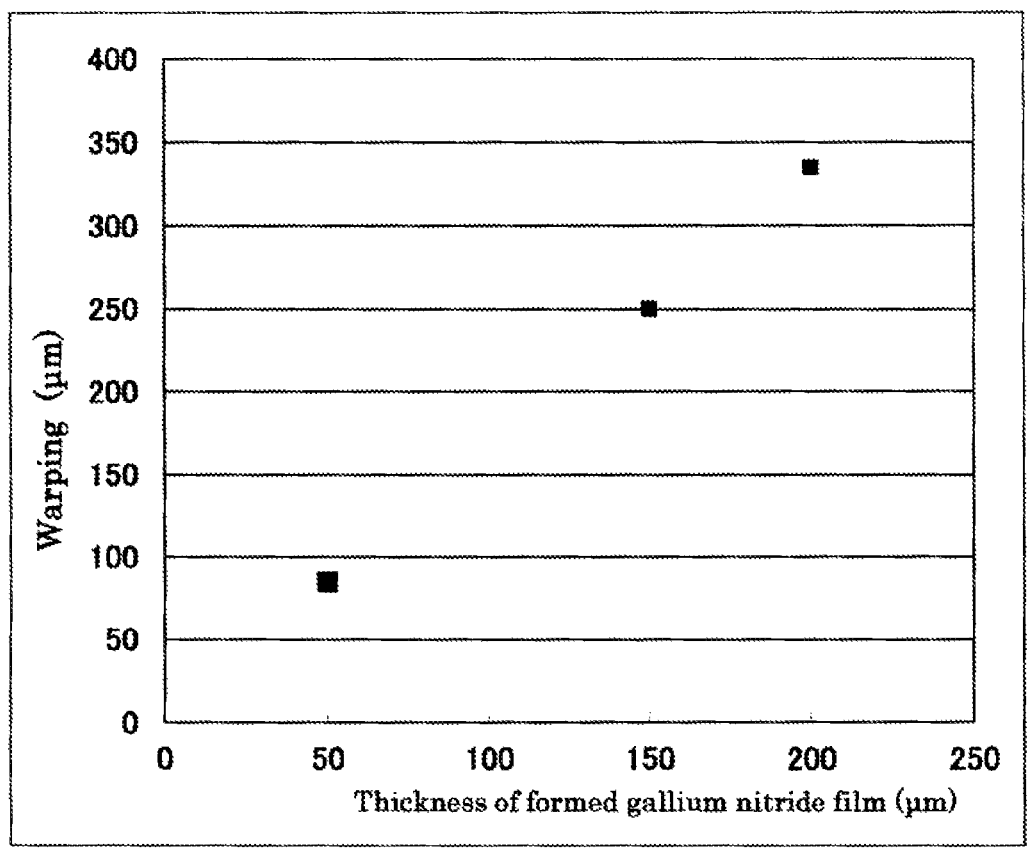
FIG. 22 is a graph showing relationship of a thickness and warping of a gallium nitride film according to a comparative example.

FIG. 22 shows a graph indicating relationship between the thickness and warping of the gallium nitride films produced in the Comparative Examples 4, 5 and 6. As can be seen from the figures, it is proved that the thickness and warping are proportional with each other in the case that the inclusion distributed layer is not present. It can be thereby speculated the value of the warping with respect to optional thickness of a gallium nitride film.

Figure 23:
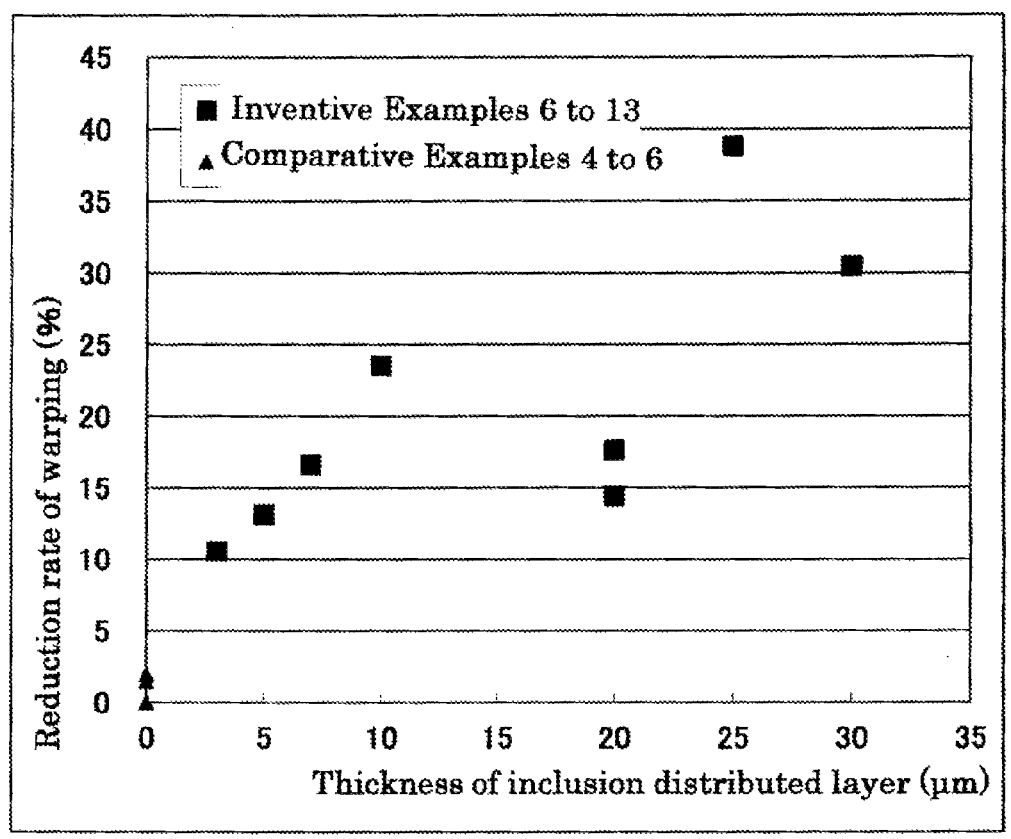
FIG. 23 is a graph showing relationship of a thickness and a reduction rate of warping of an inclusion distributed layer.

It is further calculated warping reduction rate (%), by obtaining differences between (A) values of warping of the gallium nitride films produced in the inventive examples 6 to 13 and (B) values of warping predicted in the case that the thickness is identical and the inclusion distributed layer is not present, by dividing the difference by (B) to obtain a ratio, and by then multiplying a factor of 100 to the ratio. FIG. 23 is a graph showing relationship between the thickness of the inclusion distributed layer and warping reduction rate. According to the figure, it is obtained a warping reduction rate of about 10 to 40 percent in the case that the inclusion distributed layer is present, to prove the effect of the reduction of warping.

The invention claimed is:

1. A film of a nitride of a group 13 element, said film being grown on a seed crystal substrate from a melt comprising a flux and a group 13 element, said film comprising;
   an inclusion distributed layer in a region distant by 50 μm or less from an interface of said film of a nitride of a group 13 element on the side of said seed crystal substrate, said layer comprising inclusions derived from components of said melt and;

an inclusion depleted layer with said inclusion depleted, said inclusion depleted layer being provided on said inclusion distributed layer, wherein said inclusion means a heterogenous phase surrounded by said nitride of said group 13 element, comprises an alloy of said flux and a metal of said group 13 element, a mixture of said metal of said group 13 element and said alloy, carbon, aggregate of fine crystals of said nitride of said group 13 element or polycrystalline material of said nitride of said group 13 element, and is observable by a transmission type optical microscope at a magnitude of 200.

2. The film of a nitride of a group 13 element of claim 1, wherein the maximum area of said inclusion in said inclusion distributed layer is 60 $\mu m^2$ or smaller, viewed in a cross section of said film of a nitride of a group 13 element.

3. The film of a nitride of a group 13 element of claim 1, wherein said nitride of a group 13 element comprises gallium nitride, aluminum nitride or aluminum gallium nitride.

4. The film of a nitride of a group 13 element of claim 3, wherein said nitride of a group 13 element comprises at least one of germanium, silicon and oxygen, and wherein said nitride is of n-type.

5. The film of a nitride of a group 13 element of claim 1, wherein said seed crystal substrate comprises a single crystal substrate and a seed crystal film provided on said single crystal substrate.

6. The film of a nitride of a group 13 element of claim 1, wherein a thickness of said inclusion depleted layer is 20 to 0.1 provided that a thickness of said inclusion distributed layer is 1.

7. A film of a nitride of a group 13 element, obtained by removing said inclusion distributed layer from said film of a nitride of a group 13 element of claim 1.

8. A layered body comprising a single crystal substrate, a seed crystal film formed on said substrate and said film of a nitride of a group 13 element of claim 1 formed on said seed crystal film.

9. A layered body comprising a seed crystal film and said film of a nitride of a group 13 element of claim 1 formed on said seed crystal film.

* * * * *